(12) United States Patent
Cheng et al.

(10) Patent No.: US 11,004,737 B2
(45) Date of Patent: May 11, 2021

(54) FIELD EFFECT DEVICE WITH REDUCED CAPACITANCE AND RESISTANCE IN SOURCE/DRAIN CONTACTS AT REDUCED GATE PITCH

(71) Applicant: INTERNATIONAL BUSINESS MACHINES CORPORATION, Armonk, NY (US)

(72) Inventors: Kangguo Cheng, Schenectady, NY (US); Chi-Chun Liu, Altamont, NY (US); Peng Xu, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/433,721

(22) Filed: Jun. 6, 2019

(65) Prior Publication Data

US 2019/0287850 A1    Sep. 19, 2019

Related U.S. Application Data

(62) Division of application No. 15/493,867, filed on Apr. 21, 2017, now Pat. No. 10,381,267.

(51) Int. Cl.
  *H01L 23/535* (2006.01)
  *H01L 21/768* (2006.01)
  (Continued)

(52) U.S. Cl.
  CPC .. *H01L 21/76888* (2013.01); *H01L 21/76805* (2013.01); *H01L 21/76895* (2013.01);
  (Continued)

(58) Field of Classification Search
  CPC ......... H01L 29/41791; H01L 21/76888; H01L 23/535; H01L 23/5329; H01L 23/53209;
  (Continued)

(56) References Cited

U.S. PATENT DOCUMENTS

| 5,661,085 A | * | 8/1997 | Teong | ............... H01L 21/28518 |
| | | | | 257/E21.165 |
| 6,452,277 B1 | * | 9/2002 | Tabaru | ............... H01L 21/76804 |
| | | | | 257/774 |

(Continued)

OTHER PUBLICATIONS

List of IBM Patents or Patent Applications Treated as Related dated Jun. 6, 2019, 2 pages.

(Continued)

*Primary Examiner* — Charles D Garber
*Assistant Examiner* — S M Sohel Imtiaz
(74) *Attorney, Agent, or Firm* — Tutunjian & Bitetto, P.C.; Robert Sullivan

(57) ABSTRACT

A method of forming source/drain contacts with reduced capacitance and resistance, including, forming a source/drain and a channel region on an active region of a substrate, forming a dielectric fill on the source/drain, forming a trench in the dielectric fill, forming a source/drain contact in the trench, forming an inner contact mask section on a portion of an exposed top surface of the source/drain contact, removing a portion of the source/drain contact to form a channel between a sidewall of the dielectric fill and a remaining portion of the source/drain contact, where a surface area of the remaining portion of the source/drain contact is greater than the surface area of the exposed top surface of the source/drain contact, and forming a source/drain electrode fill on the remaining portion of the source/drain contact.

20 Claims, 13 Drawing Sheets

(51) Int. Cl.
*H01L 23/532* (2006.01)
*H01L 29/417* (2006.01)

(52) U.S. Cl.
CPC ........ *H01L 23/535* (2013.01); *H01L 23/5329* (2013.01); *H01L 23/53209* (2013.01); *H01L 23/53257* (2013.01); *H01L 29/41791* (2013.01)

(58) Field of Classification Search
CPC ......... H01L 21/76895; H01L 21/76805; H01L 23/53257
See application file for complete search history.

(56) References Cited

U.S. PATENT DOCUMENTS

| | | | |
|---|---|---|---|
| 9,396,995 | B1 | 7/2016 | Patil et al. |
| 9,536,980 | B1* | 1/2017 | Huang ............... H01L 21/76877 |
| 2004/0016964 | A1* | 1/2004 | Kim ................ H01L 21/823481 |
| | | | 257/332 |
| 2005/0253192 | A1 | 11/2005 | Ban et al. |
| 2010/0187588 | A1* | 7/2010 | Kim ........................ H01L 28/91 |
| | | | 257/306 |
| 2012/0223398 | A1* | 9/2012 | Zhong ............... H01L 21/76816 |
| | | | 257/411 |
| 2013/0032888 | A1 | 2/2013 | Murata |
| 2015/0123131 | A1* | 5/2015 | Ostermann ........... H01L 23/485 |
| | | | 257/48 |
| 2015/0214228 | A1* | 7/2015 | Koh ....................... H01L 21/845 |
| | | | 257/369 |
| 2015/0243747 | A1* | 8/2015 | Kittl ................... H01L 29/41791 |
| | | | 257/401 |
| 2016/0049332 | A1* | 2/2016 | Xie .................... H01L 21/76897 |
| | | | 257/288 |
| 2016/0351566 | A1* | 12/2016 | Niimi .............. H01L 21/823418 |
| 2017/0170068 | A1* | 6/2017 | Pranatharthiharan ........................ H01L 29/4966 |
| 2017/0194423 | A1* | 7/2017 | Lin ........................ H01L 21/764 |

OTHER PUBLICATIONS

Office Action dated Dec. 23, 2019 for U.S. Appl. No. 16/433,627, 41 Pages.

\* cited by examiner

FIELD EFFECT DEVICE WITH REDUCED CAPACITANCE AND RESISTANCE IN SOURCE/DRAIN CONTACTS AT REDUCED GATE PITCH

BACKGROUND

Technical Field

The present invention generally relates to source/drain contacts configured to reduced capacitance and resistance, and more particularly to increased contact area between source/drain contacts and metal source/drain electrodes, and reduced capacitance between source/drain contacts and gate electrodes.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin approximately rectangular Si, commonly referred to as the fin with a gate on the fin, as compared to a metal-oxide-semiconductor field effect transistor (MOSFET) with a gate parallel with the plane of the substrate.

SUMMARY

In accordance with an embodiment of the present invention, a method of forming source/drain contacts with reduced capacitance and resistance is provided. The method includes forming a source/drain and a channel region on an active region of a substrate. The method further includes forming a dielectric fill on the source/drain, and forming a trench in the dielectric fill. The method further includes forming a source/drain contact in the trench. The method further includes forming an inner contact mask section on a portion of an exposed top surface of the source/drain contact, and removing a portion of the source/drain contact to form a channel between a sidewall of the dielectric fill and a remaining portion of the source/drain contact, where a surface area of the remaining portion of the source/drain contact is greater than the surface area of the exposed top surface of the source/drain contact. The method further includes forming a source/drain electrode fill on the remaining portion of the source/drain contact.

In accordance with another embodiment of the present invention, a method of forming source/drain contacts with reduced capacitance and resistance is provided. The method includes forming a source/drain and a channel region on an active region of a substrate. The method further includes forming a dielectric fill on the source/drain, and forming a trench in the dielectric fill. The method further includes forming a source/drain contact in the trench. The method further includes forming a lateral spacer and a pillar template on a portion of an exposed top surface of the source/drain contact, and removing a portion of the source/drain contact to form a channel between a sidewall of the dielectric fill and a recessed middle region, wherein a remaining portion of the source/drain contact forms a source/drain pillar, and where a surface area of the source/drain pillar is greater than the surface area of the exposed top surface of the source/drain contact. The method further includes forming a source/drain electrode fill on the remaining portion of the source/drain contact.

In accordance with another embodiment of the present invention, a field effect device having a source/drain contact with reduced capacitance and resistance is provided. The field effect device includes a source/drain and a channel region on an active region of a substrate, and a source/drain contact on a portion of the source/drain. The field effect device further includes a dielectric fill on a portion of the source/drain, where the dielectric fill is on four sides of the source/drain contact, and a channel between a portion of the dielectric fill and a portion of the source/drain contact. The device further includes a source/drain electrode fill on the remaining portion of the source/drain contact.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention relate generally to forming a source/drain contact having a modified configuration that increases the contact area between the source/drain contact and a conductive source/drain electrode fill to decrease resistance between the source/drain contact and source/drain electrode fill, while also altering the distance and intervening materials to reduce the parasitic capacitance between the source/drain contact and neighboring conductive gate electrodes.

Embodiments of the present invention also relate generally to forming source/drain contacts with features that increase the available surface area for forming an interface with a conductive source/drain electrode fill by removing a portion of a source/drain contact to form vertical sidewalls with an adjacent trench. The features can be 3-dimensional (3-D) features having multiple additional surfaces (e.g., vertical and horizontal) that increase the total contact surface area between the conductive source/drain electrode fill and source/drain contact.

Embodiments of the present invention also relate generally to filling a portion of the trench with a dielectric material to reduce the capacitance between a source/drain contact and conductive source/drain electrode fill and a neighboring gate structure including a conductive gate electrode.

Exemplary applications/uses to which the present invention can be applied include, but are not limited to: logic (e.g., NAND, NOR, XOR, etc.) and memory devices (e.g., SRAM, DRAM, etc.) utilizing field effect transistor (FET) devices.

It is to be understood that the present invention will be described in terms of a given illustrative architecture; however, other architectures, structures, substrates, materials, and process features and steps can be varied within the scope of the present invention.

Figure 1:
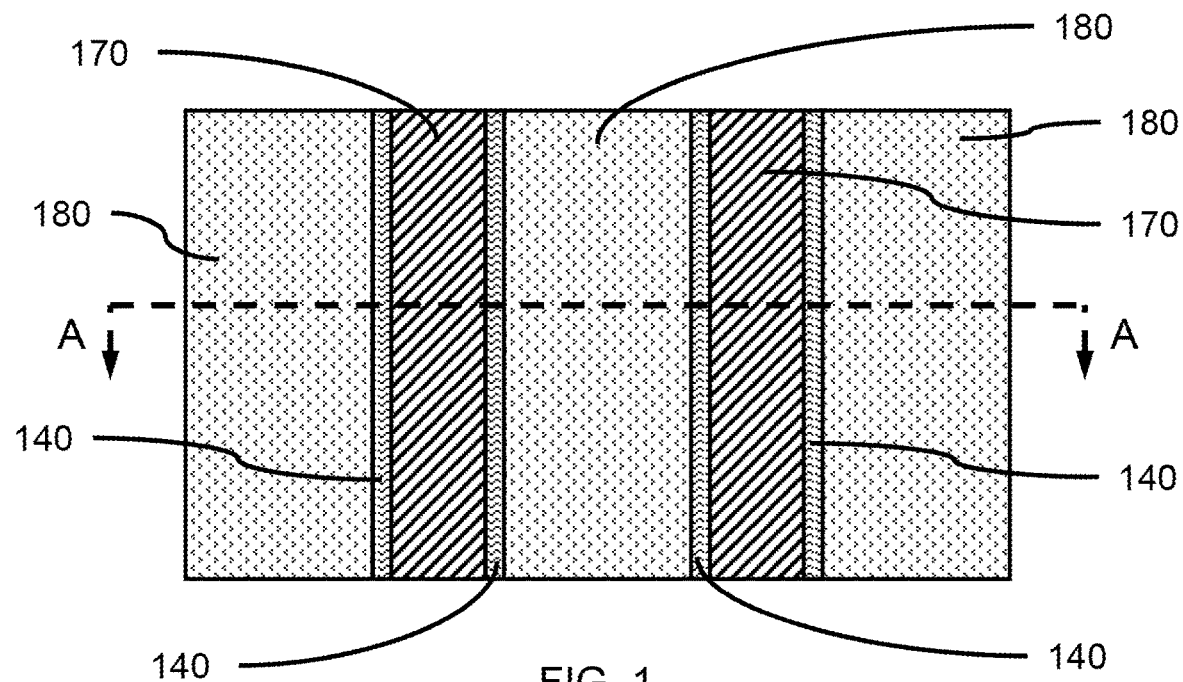
FIG. 1 is a top view showing a dielectric fill adjacent to a gate cap, where the gate cap and dielectric fill are separated by a gate spacer, in accordance with an embodiment of the present invention.

Referring now to the drawings in which like numerals represent the same or similar elements and initially to FIG. 1, a top view of a dielectric fill adjacent to a gate cap, where the gate cap and dielectric fill are separated by a gate spacer, is shown in accordance with an embodiment of the present invention.

In one or more embodiments, a dielectric fill 180 can be formed on a source/drain 120 on a substrate 110, where the dielectric fill 180 can be blanket deposited to fill in the spaces between gate spacers 140 on a gate structure. The dielectric fill 180 can cover the source/drain 120, where the dielectric fill 180 can have a height from the surface of the source/drain 120 to the top surface of a gate cap 170 on a gate structure. A gate structure can include a gate dielectric layer, a work function layer, and a conductive gate fill layer.

In one or more embodiments, the dielectric fill 180 can have a height in the range of about 20 nm to about 80 nm, or in the range of about 30 nm to 60 nm, although other heights are also contemplated.

In one or more embodiments, the dielectric fill 180 can be silicon oxide (SiO), a low-k dielectric, a flowable polymeric material, or a combination thereof. In one or more embodiments, the dielectric fill 180 can be bounded on at least one side by a gate spacer 140 that can separate the dielectric fill 180 from a gate structure. The gate spacer 140 can be a dielectric material different from the dielectric fill 180, so the dielectric fill 180 can be selectively etched relative to the gate spacer 140.

In one or more embodiments, a gate cap 170 can be adjacent to at least a portion of the gate spacer 140, where the gate cap 170 can be on a side of the gate spacer opposite the dielectric fill 180. The gate cap 170 can cover a dummy gate structure or a functional gate structure to protect the gate structure during subsequent processing. There can be a gate spacer 140 on either side of a dielectric fill 180 and on either side of a gate cap 170, such that a gate spacer 140 physically and electrically separates a dielectric fill 180 from a gate cap 170 and underlying gate structure.

In various embodiments, the gate cap 170 can be silicon oxide (SiO), silicon nitride (SiN), silicon oxynitride (SiON), silicon carbonitride (SiCN), silicon boronitride (SiBN), silicon carbide (SiC), silicon borocarbide (SiBC), silicon boro carbonitride (SiBCN), boron carbide (BC), boron nitride (BN), titanium nitride (TiN), or combinations thereof, where the gate cap 170 can be selectively etchable relative to the gate spacer 140 and dielectric fill 180.

Figure 2:
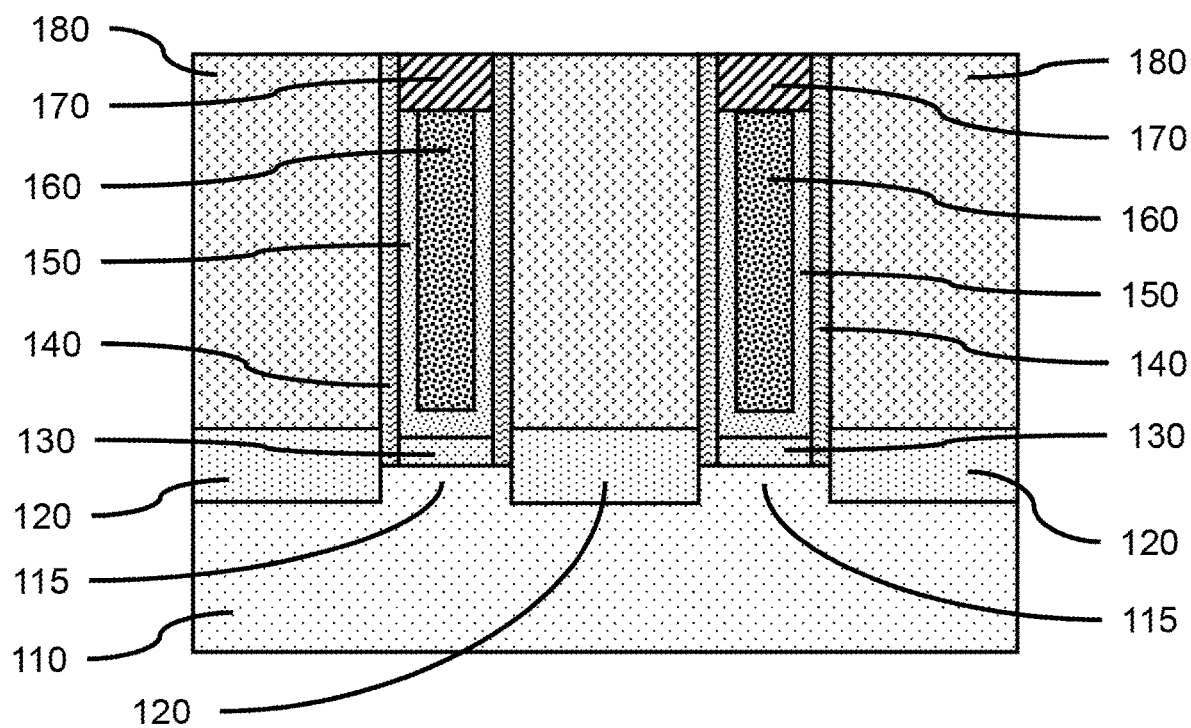
FIG. 2 is a side view of the AA cross-section of FIG. 1 showing a substrate including active device regions, source/drain regions, and gate structures on channel regions, in accordance with an embodiment of the present invention.

FIG. 2 is a side view of the AA cross-section of FIG. 1 showing a substrate including active device regions, source/drain regions, and gate structures on channel regions, in accordance with an embodiment of the present invention.

In one or more embodiments, a dielectric fill 180 can be formed on a substrate 110, where the substrate can include active regions that can provide a channel for a field effect transistor (FET) device, where the channel can be in the substrate or implemented as a vertical fin on the substrate 110.

In one or more embodiments, a substrate 110 can be a semiconductor or an insulator with an active surface semiconductor layer. The substrate can include crystalline, semicrystalline, microcrystalline, or amorphous regions. The substrate 110 can include a carrier layer to mechanically support thinner layers. The substrate 110 can also have multiple material layers, for example, a semiconductor-on-insulator substrate (SeOI). In one or more embodiments, the substrate 110 can be a silicon wafer.

In one or more embodiments, a source/drain 120 can be formed on one or more active regions of the substrate 110, where the source/drains 120 can be epitaxially grown on the crystalline surface of the substrate or implanted into a region of the substrate. A source/drain 120 can be formed on opposite sides of a channel region 115, where the channel region can be a section of the substrate 110. A gate structure can be formed above the channel region 115, where a gate dielectric layer 130 can physically and electrically separate the channel region 115 from a conductive gate electrode including an optional work function layer 150 and a conductive gate fill layer 160.

In one or more embodiments, a gate dielectric layer 130 can be formed on the channel region 115 of a substrate 110, which may be a vertical fin. The gate dielectric layer 130 can be formed on three exposed sides of a vertical fin, or on a surface of the substrate (e.g., for a MOSFET).

In one or more embodiments, the gate dielectric layer 130 can be an insulating dielectric layer, for example, a silicon oxide (SiO), silicon nitride (SiN), silicon oxynitride (SiON), a high-K dielectric, or a suitable combination of these materials.

In one or more embodiments, the gate dielectric layer 130 can have a thickness in the range of about 1 nm to about 4 nm, or can have a thickness in the range of about 1 nm to about 2 nm.

In one or more embodiments, a work function layer 150 can be formed on the exposed surfaces of the gate dielectric layer 130 and gate spacer 140, where the work function layer 160 can be conformally deposited.

In one or more embodiments, a work function layer 150 can be formed on the gate dielectric layer 130, where the work function layer 150 and gate dielectric layer 130 can surround at least a portion of a channel region (e.g., vertical fin), as a part of a gate structure. The work function layer 150 can be formed on the gate dielectric layer 130 to adjust the electrical properties of a gate electrode. In various embodiments, the work function layer can be optional. In various embodiments, a work function layer 150 can be a conductive nitride, a conductive carbide, or combinations thereof. The work function layer 150 can include multiple layers of work function materials.

In various embodiments, the work function layer 150 can have a thickness of about 1 nm to about 11 nm, or can have a thickness of about 1 nm to about 3 nm.

In one or more embodiments, a conductive gate fill layer 160 can be formed on the gate dielectric layer 130 and/or work function layer 150 if present, where the gate fill layer 160 can fill in a void space between vertical sidewalls of the gate spacer 140, gate dielectric layer 130, and/or work function layer 150 if present. The gate fill layer 160, gate dielectric layer 130, and optionally the work function layer 150, can form a gate structure on one or more channel regions 115, where the gate fill layer 160 and work function layer 150 can form a conductive gate electrode.

In various embodiments, the gate fill layer 160 can be a p-doped poly silicon (p-Si), an n-doped poly silicon (p-Si), a conductive metal, where the metal can be tungsten (W) or cobalt (Co), or a conductive carbon material, or a suitable combinations thereof. The gate fill layer 160 can form a pFET or an nFET.

In one or more embodiments, the gate fill layer 160, gate dielectric layer 130 and/or work function layer 150 if present, can be recessed to provide space for formation of a gate cap 170. In various embodiments, each of the gate fill layer 160, gate dielectric layer 130 and/or work function layer 150 can be removed using a selective etch. The gate fill layer 160 and work function layer 150 can be recessed to a depth sufficient to provide space for formation of a gate cap 170.

In one or more embodiments, the gate structure can have a width in the range of about 10 nm to about 40 nm, or in the range of about 15 nm to about 30 nm, or in the range of about 10 nm to about 25 nm. The width of the gate structure can determine a gate length of the FET device.

In one or more embodiments, the channel region 115 can have a length in the range of about 15 nm to about 100 nm, or in the range of about 20 nm to about 75 nm, or in the range of about 30 nm to about 50 nm, where the length of the channel region 115 can determine the width of a gate structure.

Figure 3:
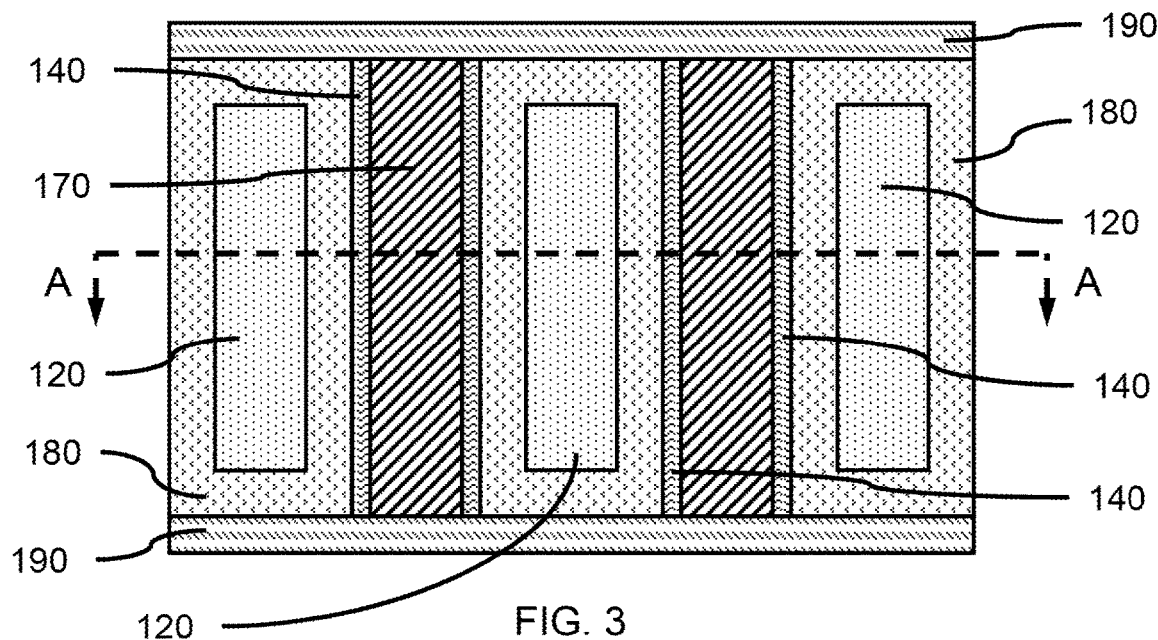
FIG. 3 is a top view showing a portion of the dielectric fill removed from adjacent to the gate spacers, in accordance with an embodiment of the present invention.

FIG. 3 is a top view showing a portion of the dielectric fill removed from adjacent to the gate spacers, in accordance with an embodiment of the present invention.

In one or more embodiments, a portion of the dielectric fill 180 can be removed from a region over a source/drain 120. The portion of the dielectric fill 180 can be removed using a selective directional etch, for example, a reactive ion etch (RIE), where the removal process can form sloping sidewalls from the dielectric fill 180. Removal of the portion of the dielectric fill 180 can expose the underlying source/drain 120, while leaving a layer of the dielectric fill 180 surrounding the trench 185. A remaining portion of the dielectric fill 180 can be adjacent to the gate spacer 140 and a gate structure. The gate cap 170 can mask and protect the gate structure (active or dummy) during formation of the trench 185, for example, by an RIE.

In one or more embodiments, the exposed portion of the source/drain 120 can have a width in the range of about 20 nm to about 100 nm, or in the range of about 30 nm to about 60 nm. The exposed portion of the source/drain can have a length in the range of about 10 nm to about 500 nm, or in the range of about 20 nm to about 100 nm. The thickness of the dielectric fill 180 at the interface with the source/drain 120 can be in the range of about 20 nm to about 80 nm, or in the range of about 30 nm to about 60 nm. An outer annular region of the source/drain 120 can remain covered by a portion of the dielectric fill 180.

In various embodiments, a masked region 190 can delineate, cover and protect portions of the substrate not being processed.

Figure 4:
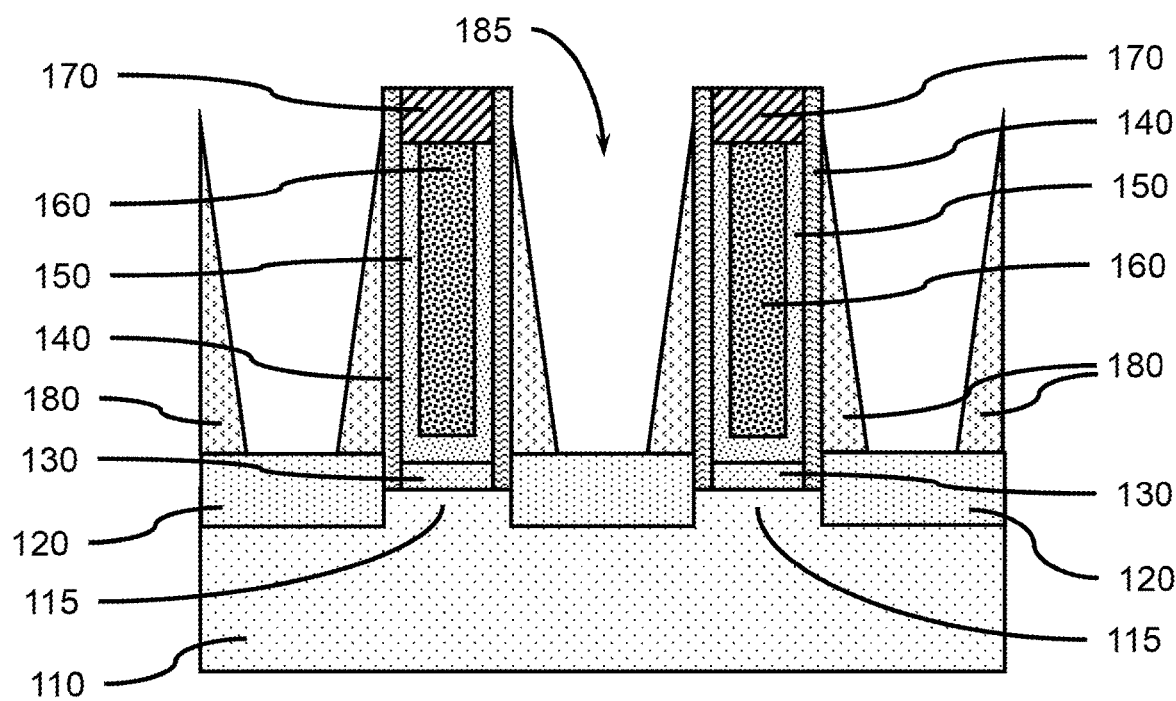
FIG. 4 is a side view of the AA cross-section of FIG. 3 showing a portion of the dielectric fill removed to form trenches in regions adjacent to the gate structures, in accordance with an embodiment of the present invention.

FIG. 4 is a side view of the AA cross-section of FIG. 3 showing a portion of the dielectric fill removed to form trenches in regions adjacent to the gate structures, in accordance with an embodiment of the present invention.

In one or more embodiments, the trench 185 can have sloping sidewalls formed by the removal process that leaves a portion of the dielectric fill 180 on the vertical wall of the adjacent gate spacer 140. The dielectric fill 180 can be removed down to the source/drain 120, where at least a portion of the source/drain is exposed to provide for contact with a subsequently formed source/drain contact. The sidewalls of the dielectric fill 180 can extend up the gate spacer(s) 140 to a height below the top surface of the gate spacer 140. An upper portion of the gate spacer 140 can be exposed by formation of the trench 185. A portion of the gate spacer 140 below the level of the bottom surface of the gate cap 170 may still be covered by the remaining portion of the dielectric fill 180. In various embodiments, the gate spacer height can be the same as the gate height.

In one or more embodiments, a conductive gate electrode including a conductive gate fill layer 160 and a conductive work function layer 150 can be physically and electrically separated from a conductive source/drain contact by an insulating dielectric fill 180 and insulating gate spacer 140.

Figure 5:
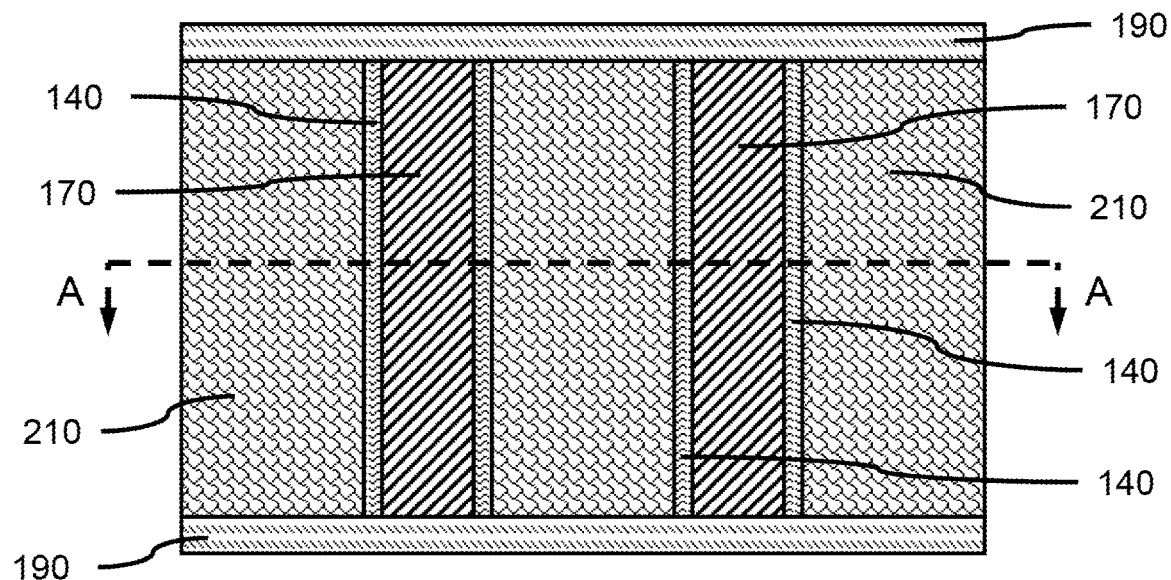
FIG. 5 is a top view showing the source/drain contacts covered by a contact mask layer, in accordance with an embodiment of the present invention.

FIG. 5 is a top view showing the source/drain contacts covered by a contact mask layer, in accordance with an embodiment of the present invention.

In one or more embodiments, a source/drain contact can be formed in each of the trenches in the dielectric fill. A conductive contact layer can be formed in the trench(es) 185, where the conductive contact layer can be conformally and/or blanket deposited to fill in the trench(es) 185. The conductive contact layer above the gate cap 170 can be removed by a chemical-mechanical polish (CMP) to form a source/drain contact 200 in each trench 185 separated from the neighboring source/drain contact(s) 200 by intervening dielectric fill 180, gate spacer(s) 140, gate structures, and gate cap 170. The dielectric fill 180 can be on four sides of the source/drain contact 200 in the trench 185. The source/drain contact(s) 200 can be a conductive metal, including, but not limited to, tungsten (W), cobalt (Co), and suitable combinations thereof.

In one or more embodiments, the source/drain contact(s) 200, gate spacer(s) 140, and gate cap(s) 170 can have smooth, flat surfaces provided by the CMP. The source/drain contact(s) 200 can be self-aligned with the gate structures due to the position and thickness of the gate spacer(s) 140.

In one or more embodiments, a source/drain contact 200 can have a contact area at the interface with the source/drain 120 in the range of about 200 $nm^2$ to about 4000 $nm^2$, or in the range of about 800 $nm^2$ to about 2000 $nm^2$.

In one or more embodiments, the source/drain contacts 200 can have a reduced height, and be separated from the gate caps 170 by a gate spacer 140. A portion of the source/drain contact(s) 200 can be removed to reduce the height of the source/drain contact(s) 200 relative to the tops surface of the gate spacer(s) 140 and gate cap(s) 170.

In one or more embodiments, a portion of the source/drain contact(s) 200 can be removed using a selective directional etch (e.g., RIE) to reduce the height of the source/drain contact(s). After removal, the top surface of the source/drain contact(s) 200 can still be above the level of the bottom surface of the gate cap(s) 170, so the top surface of the source/drain contact(s) are above the top of the gate structure. The height of the source/drain contact(s) 200 can be reduced by about 5 nm to about 15 nm to provide space for formation of a contact mask layer.

In one or more embodiments, the recessed source/drain contact(s) 200 can be covered with a contact mask layer 210, where the contact mask layer 210 can be a polymeric material. In various embodiments, the contact mask layer 210 can be a directed self-assembly (DSA) copolymer. The DSA copolymer can provide well-ordered patterns with feature sizes below the resolution of conventional lithography. The DSA copolymer can be a block copolymer that can undergo microphase separation. In various embodiments, feature sizes in the range of about 3 nm to about 100 nm can be obtained by formation of block copolymer domains.

In one or more embodiments, the DSA copolymer can be, for example, a block copolymer of polystyrene (PS) and poly methyl methacrylate (PMMA). In various embodiments, the DSA copolymer can be 50% PMMA and 50% PS mixture in solution. A low temperature anneal can cause phase separation of the different block-copolymer constituents into different regions. The DSA can phase separate horizontally to form separate regions on the source/drain contact(s) due to different polymer chain lengths.

Figure 6:
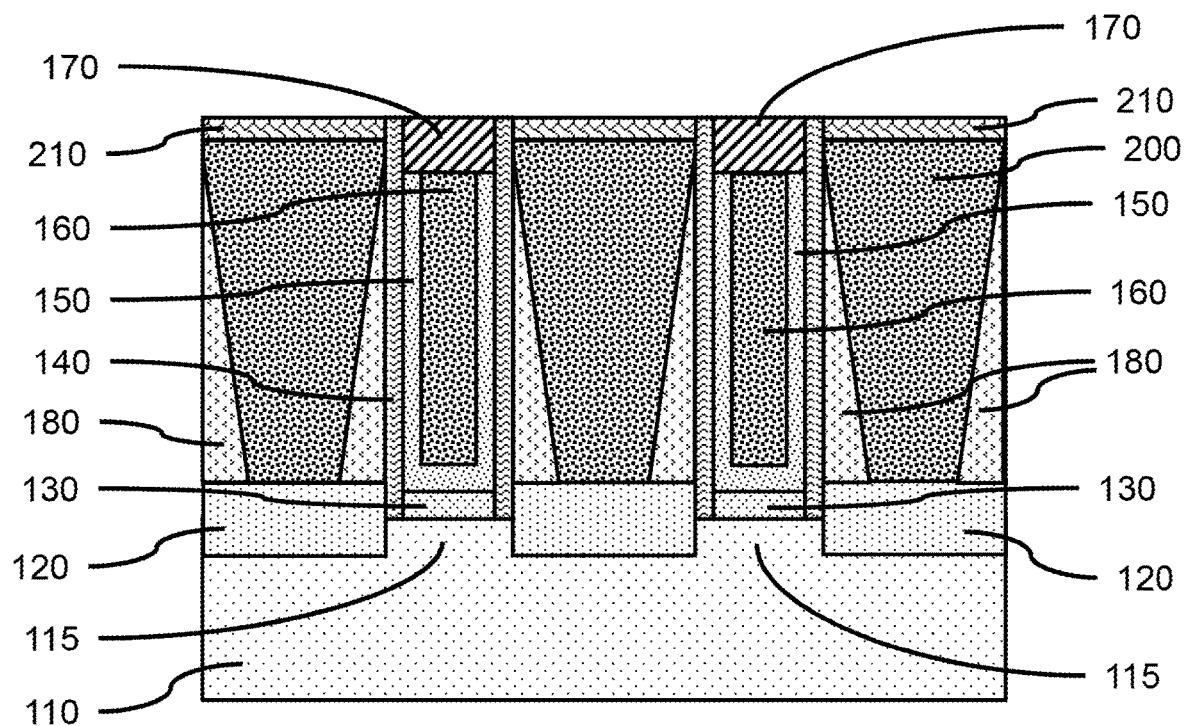
FIG. 6 is a side view of the AA cross-section of FIG. 5 showing the contact mask layer on the source/drain contacts, in accordance with an embodiment of the present invention.

FIG. 6 is a side view of the AA cross-section of FIG. 5 showing the contact mask layer on the source/drain contacts, in accordance with an embodiment of the present invention.

In one or more embodiments, excess contact mask layer 210 material can be removed by CMP to provide a smooth, flat surface. The contact mask layer 210 can be physically separated from an adjacent gate cap 170 by a gate spacer 140.

In various embodiments, the contact mask layer 210 can have a thickness in the range of about 5 nm to about 15 nm, or in the range of about 5 nm to about 10 nm.

Figure 7:
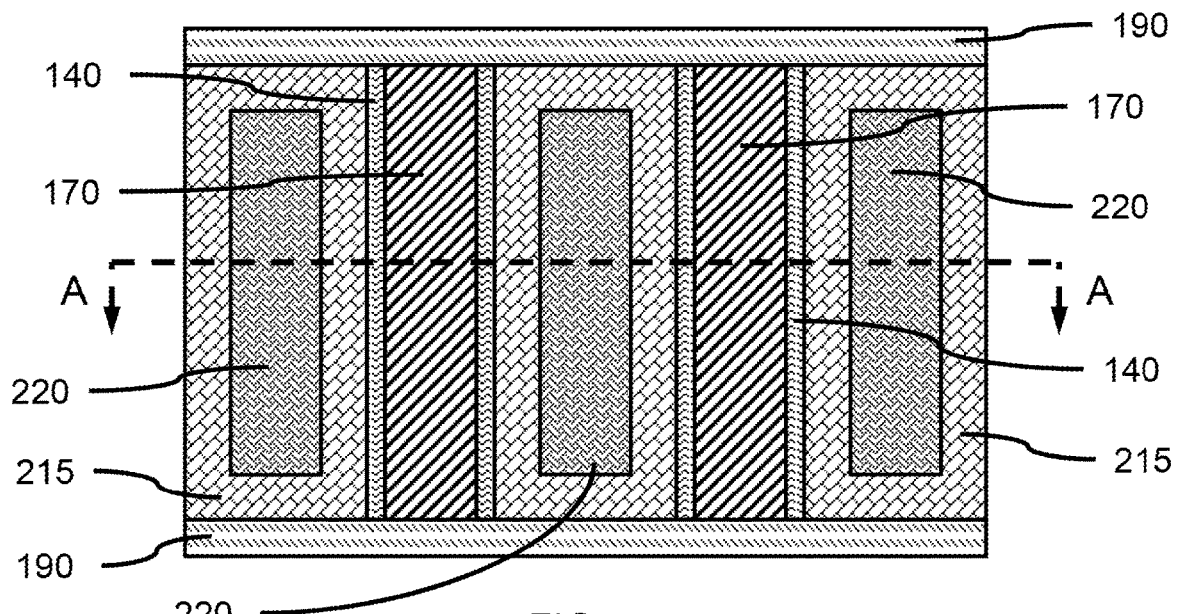
FIG. 7 is a top view showing the contact mask layer partitioned into an inner contact mask section and a border contact mask section, in accordance with an embodiment of the present invention.

FIG. 7 is a top view showing the contact mask layer partitioned into an inner contact mask section and a border contact mask section, in accordance with an embodiment of the present invention.

In one or more embodiments, the contact mask layer 210 can be heat treated to undergo a microphase separation to form a first phase region that can be a border contact mask section 215, and a second phase region that can be an inner contact mask section 220. In various embodiments, the first phase region can be a first block copolymer, and a second phase region can be a second block copolymer. The first phase region and second phase region may be reversed, so the second block copolymer forms the border contact mask section 215 and the first block copolymer forms the inner contact mask section 220.

Figure 8:
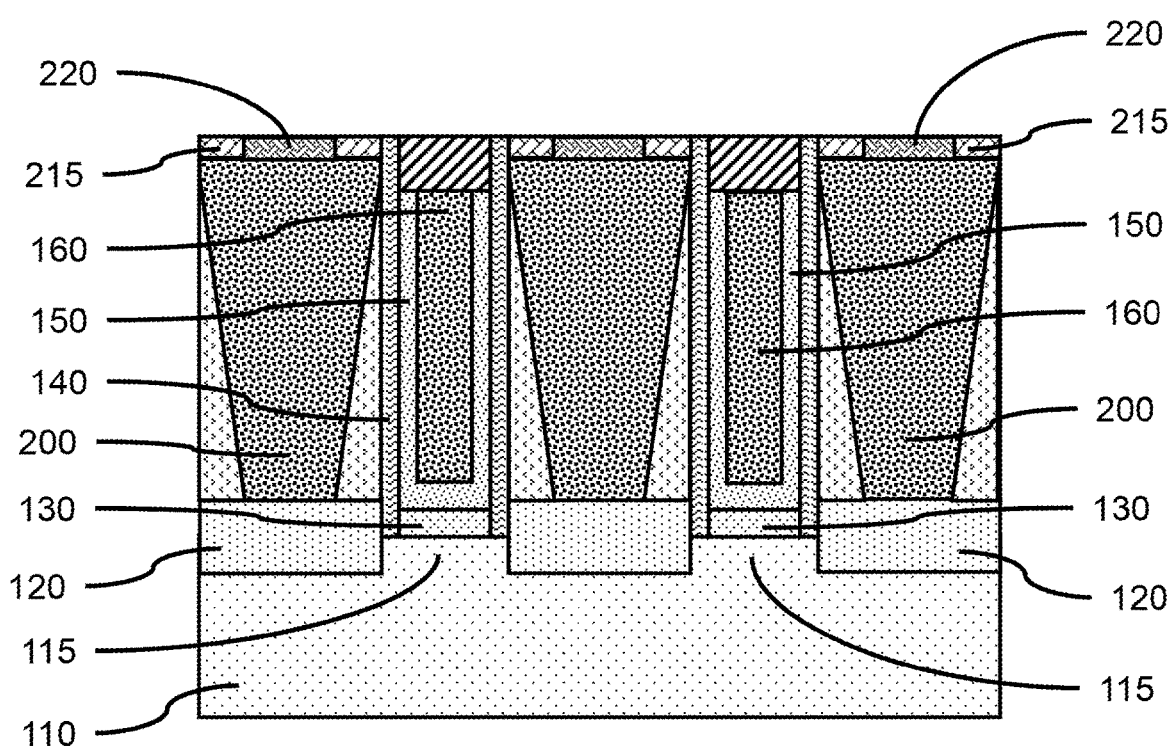
FIG. 8 is a side view of the AA cross-section of FIG. 7 showing the contact mask layer partitioned into an inner contact mask section and a border contact mask section, in accordance with an embodiment of the present invention.

FIG. 8 is a side view of the AA cross-section of FIG. 7 showing the contact mask layer partitioned into an inner contact mask section and a border contact mask section, in accordance with an embodiment of the present invention.

In one or more embodiments, the first phase region and second phase region form a defined inner contact mask section 220 and border contact mask section 215, separated by a phase boundary between the first block copolymer and second block copolymer.

Figure 9:
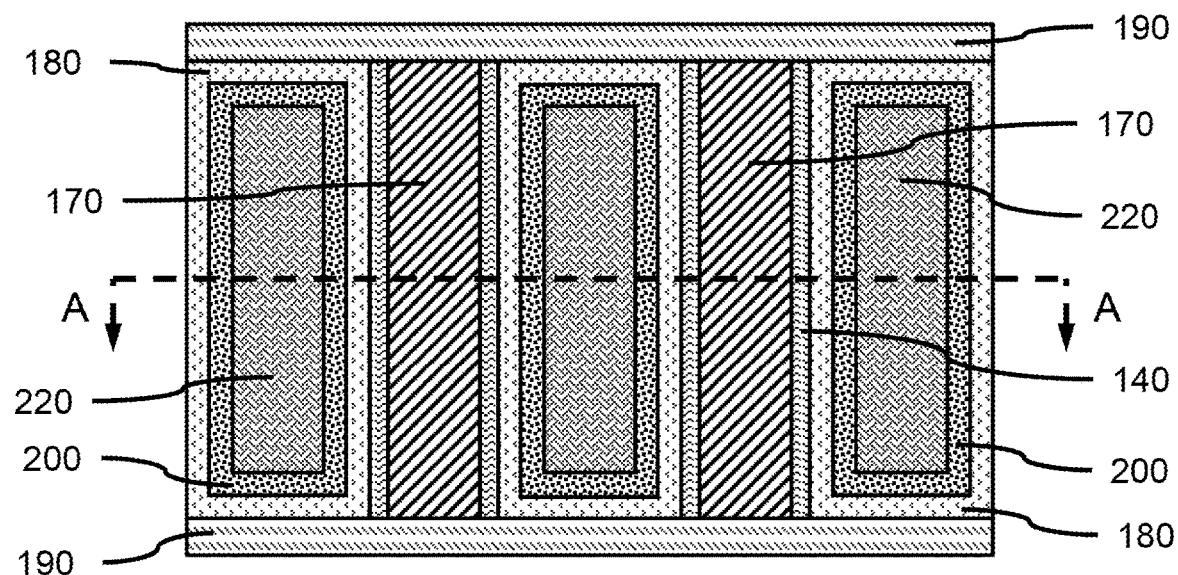
FIG. 9 is a top view showing a channel surrounding a portion of a source/drain contact, in accordance with an embodiment of the present invention.

FIG. 9 is a top view showing a channel surrounding a portion of a source/drain contact, in accordance with an embodiment of the present invention.

In one or more embodiments, the border contact mask section 215 can be removed from around the inner contact mask section 220 to expose portions of the source/drain contacts 200. The border contact mask section 215 can be removed to expose the underlying surface of the source/drain contact 200, where the border contact mask section 215 can be removed by selectively etching the first block copolymer (or second block copolymer), while the other block copolymer remains as the inner contact mask section 220 on the source/drain contact 200.

In one or more embodiments, the inner contact mask section 220 can have a width in the range of about 5 nm to about 50 nm, or in the range of about 10 nm to about 35 nm, and a length in the range of about 5 nm to about 50 nm, or in the range of about 10 nm to about 35 nm. The border contact mask section 215 can have a width in the range of about 5 nm to about 50 nm, or in the range of about 10 nm to about 35 nm. The dimensions of the inner contact mask section 220 and border contact mask section 215 can be controlled by changes to the polymer chain lengths forming the different copolymer blocks (e.g., PS and PMMA). An annular border of the source/drain contact 200 and a portion of the gate spacer 140 can be exposed by removal of the border contact mask section 215.

In one or more embodiments, a portion of the source/drain contact 200 can be removed to form a channel 204 between the sidewalls of the dielectric fill 180 and the remaining central portion 202 of the source/drain contact 200. Removal of the portion of the source/drain contact 200 can leave a remaining portion of the source/drain contact 200 under the inner contact mask section 220. The channel 204 can surround the central portion 202 of the source/drain contact 200 and expose a surface of the remaining source/drain contact 200 at a predetermined depth below the top of the central portion.

Figure 10:
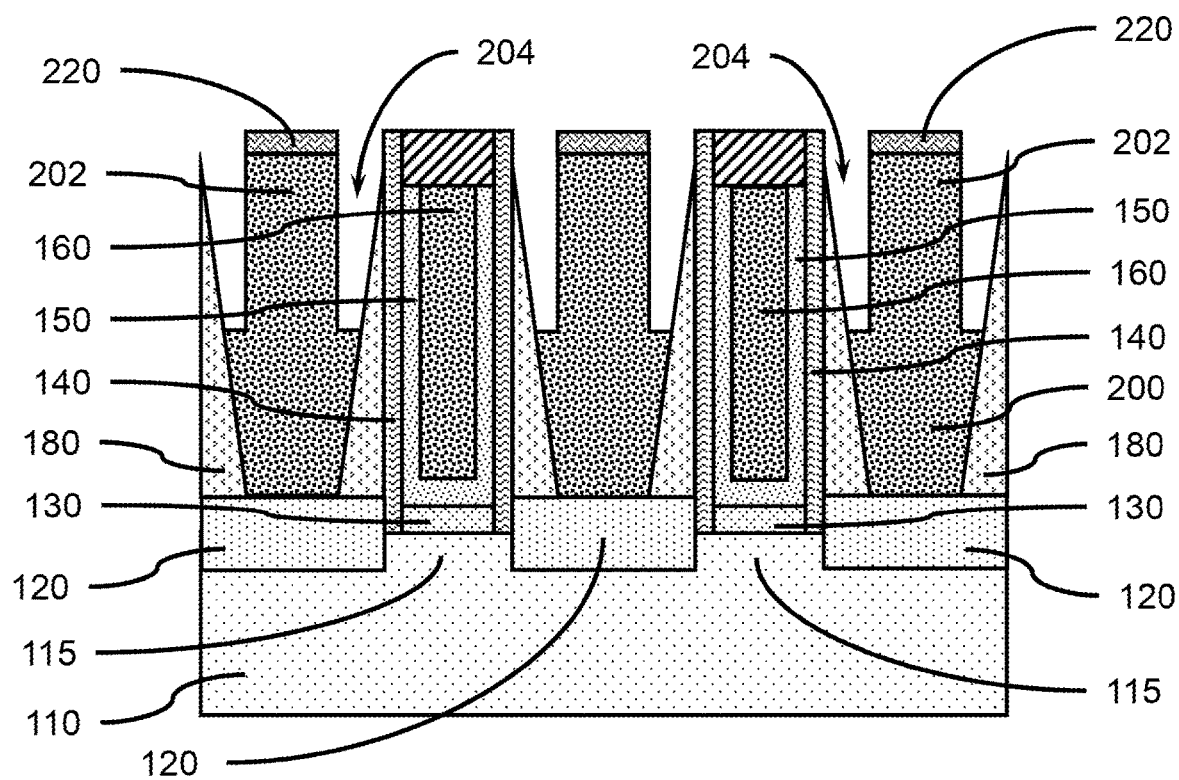
FIG. 10 is a side view of the AA cross-section of FIG. 9 showing the channel exposing portions of the source/drain contacts and dielectric fill trench sidewalls, in accordance with an embodiment of the present invention.

FIG. 10 is a side view of the AA cross-section of FIG. 9 showing the channel exposing portions of the source/drain contacts and dielectric fill trench sidewalls, in accordance with an embodiment of the present invention.

In one or more embodiments, formation of the channel 204 can expose a portion of the dielectric fill 180. The channels 204 can be formed by a directional etch (e.g., RIE) that can form vertical sidewalls on the central portion 202 of the source/drain contact 200. Formation of the channels 204 can increase the exposed surface area of the source/drain contact 200 by the surface area of the central portion 202. The surface area of the central portion 202 can be 2 times the sum of width of the central portion 202 plus 2 times the length of the central portion 202 times the height of the central portion 202 (i.e., depth of the channel 204). The height of the central portion 202 can be in the range of about 10 nm to about 80 nm, or in the range of about 20 nm to about 60 nm.

Figure 11:
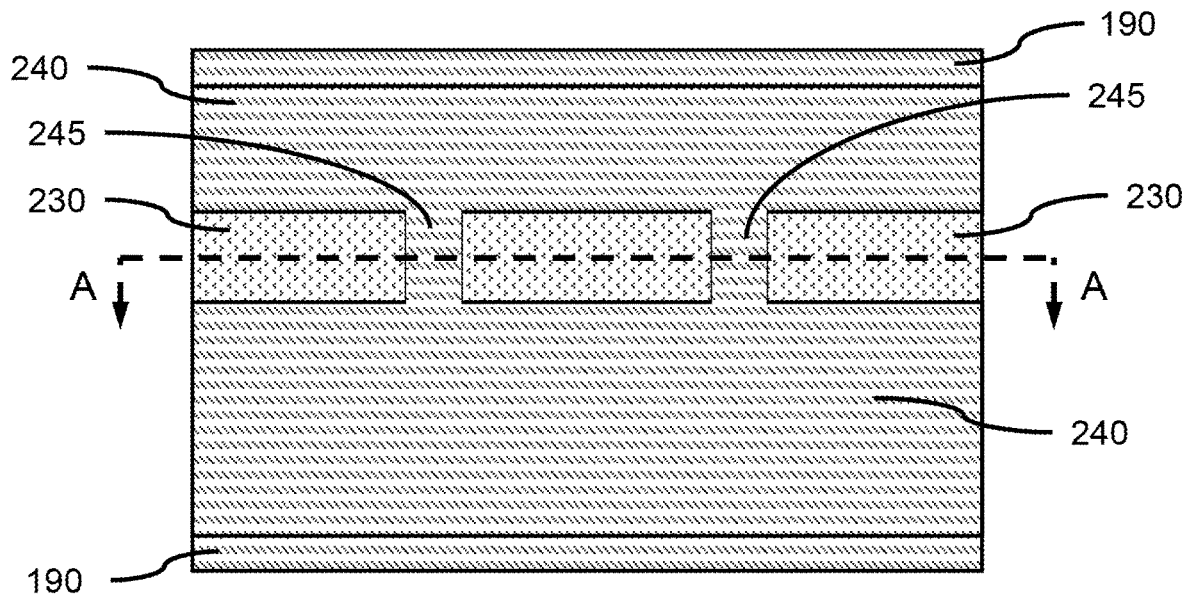
FIG. 11 is a top view showing a patterned cover layer on an interlayer dielectric layer that fills in the channels and covers the inner contact mask sections and gate caps, in accordance with an embodiment of the present invention.

FIG. 11 is a top view showing a patterned cover layer on an interlayer dielectric layer that fills in the channels and covers the inner contact mask sections and gate caps, in accordance with an embodiment of the present invention.

In one or more embodiments, an interlayer dielectric (ILD) layer 230 can be formed in the channel(s) 204, where the interlayer dielectric layer 230 can extend above the top surfaces of the inner contact mask section(s) 220 and gate cap(s) 170.

In one or more embodiments, the interlayer dielectric layer 230 can be silicon oxide (SiO), a low-k dielectric, a flowable polymeric material, or a combination thereof. The ILD layer 230 can be blanket deposited on the gate cap 170, inner contact mask section(s) 220, and source/drain contact 200, and a chemical-mechanical polishing used to reduce the height of the ILD layer 230 to provide a smooth, flat surface.

The interlayer dielectric layer 230 can be a different material from the inner contact mask section(s) 220, dielectric fill 180, and gate cap 170, so the interlayer dielectric layer 230 can be selectively removed relative to the inner contact mask section(s) 220, dielectric fill 180, and gate cap 170. In various embodiments, the ILD layer 230 and dielectric fill 180 can be the same material, so both can be removed by the same etching process step.

In one or more embodiments, a cover layer 240 can be formed and patterned on the interlayer dielectric layer 230 to form aligned openings exposing predetermined portions of the underlying interlayer dielectric layer 230, such that bridging segments 245 are formed from the cover layer 240 that remain above at least a portion of the gate cap(s) 170. The bridging segments 245 can separate neighboring openings. In various embodiments, the cover layer 240 can be a polymeric resist material that can be patterned and developed to form the openings.

Figure 12:
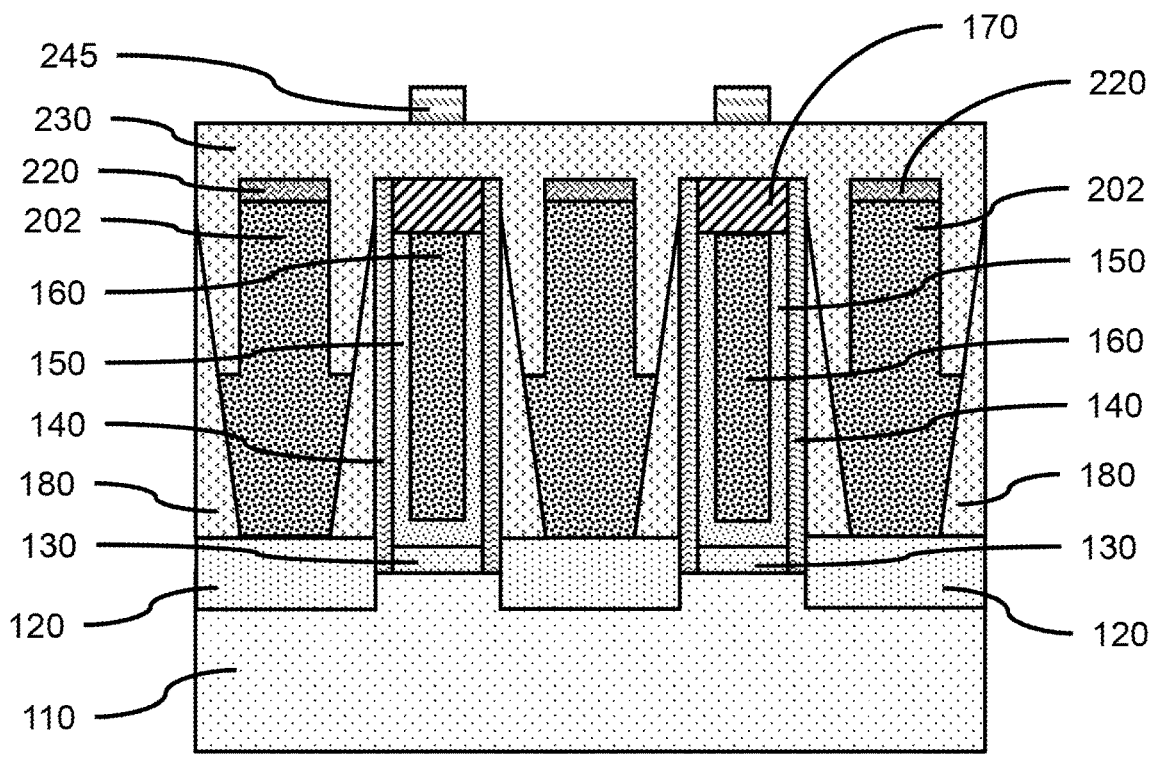
FIG. 12 is a side view of the AA cross-section of FIG. 11 showing a portion of the cover layer on the interlayer dielectric layer over the gate caps, in accordance with an embodiment of the present invention.

FIG. 12 is a side view of the AA cross-section of FIG. 11 showing a portion of the cover layer on the interlayer dielectric layer over the gate caps, in accordance with an embodiment of the present invention.

In one or more embodiments, the bridging segments 245 can cover at least a portion of the gate cap(s) 170.

Figure 13:
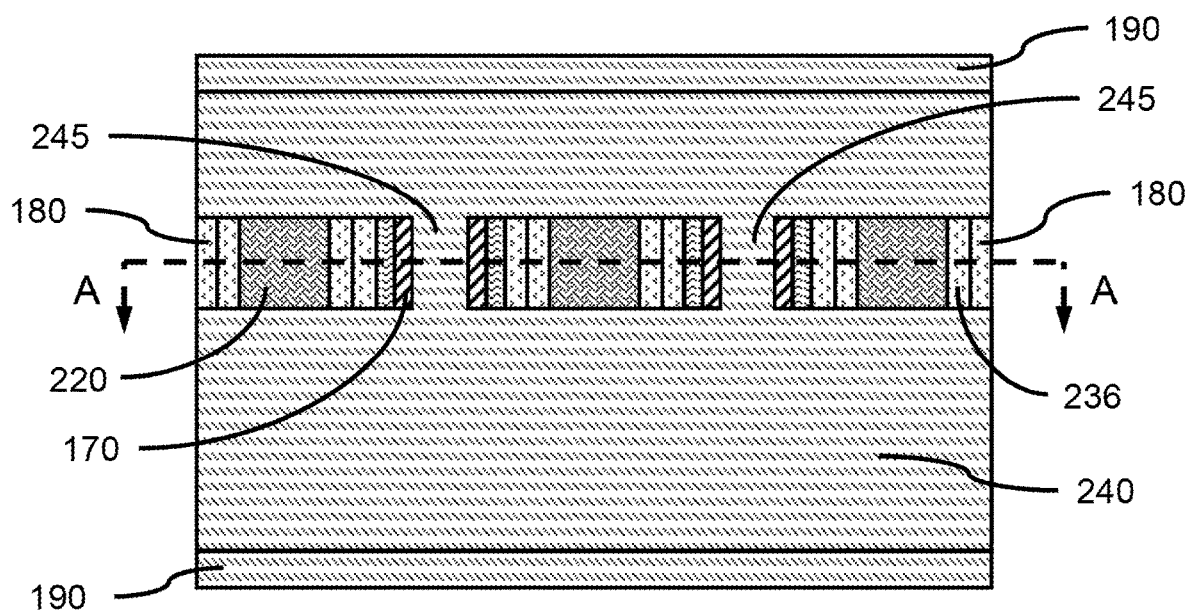
FIG. 13 is a top view showing aligned openings in the cover layer and interlayer dielectric layer exposing a portion of the source/drain contacts and dielectric fill, in accordance with an embodiment of the present invention.

FIG. 13 is a top view showing aligned openings in the cover layer and interlayer dielectric layer exposing a portion of the source/drain contacts and dielectric fill, in accordance with an embodiment of the present invention.

In one or more embodiments, the portion(s) of the interlayer dielectric layer 230 exposed by the openings in the cover layer 240 can be removed, whereas the portion(s) of the interlayer dielectric layer 230 covered by the bridging segments 245 can provide underlying ILD segments 235. A portion of the gate spacer(s) 140 and gate cap(s) can be exposed by the partial removal of the interlayer dielectric layer 230.

Figure 14:
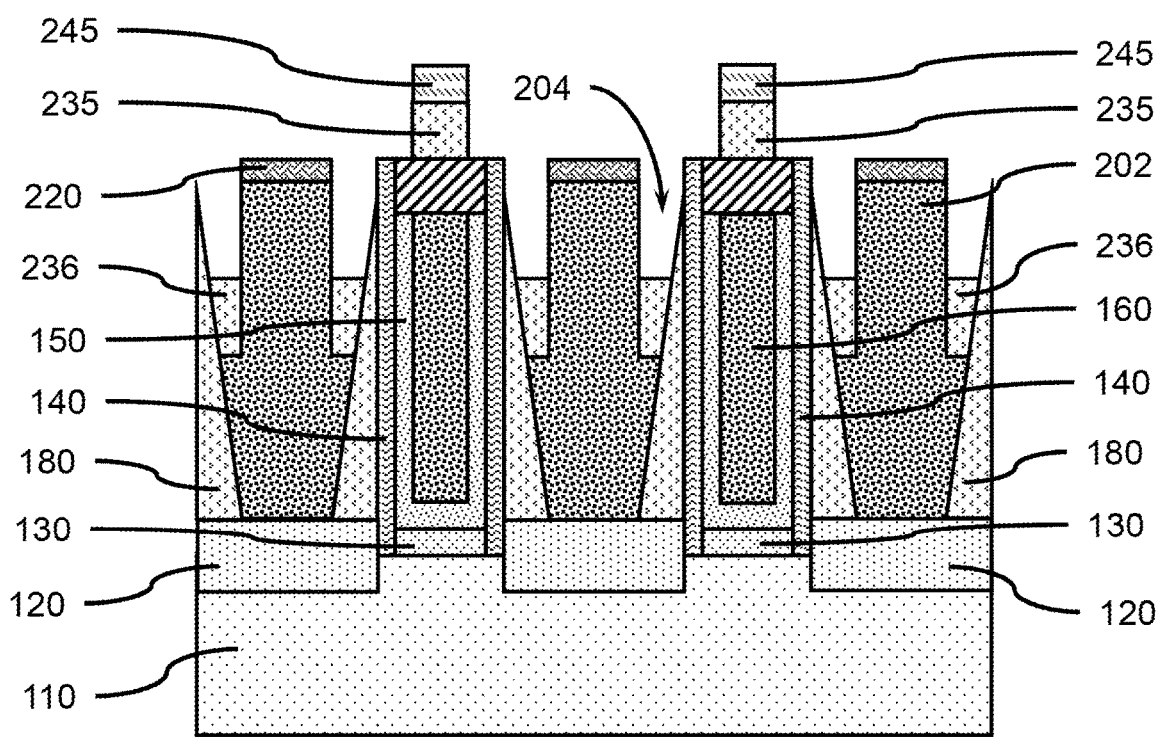
FIG. 14 is a side view of the AA cross-section of FIG. 13 showing the inner contact mask section and channels in the source/drain contacts exposed by the openings in the cover layer and interlayer dielectric layer, in accordance with an embodiment of the present invention.

FIG. 14 is a side view of the AA cross-section of FIG. 13 showing the inner contact mask section and channels in the source/drain contacts exposed by the openings in the cover layer and interlayer dielectric layer, in accordance with an embodiment of the present invention.

Removal of the portion(s) of the interlayer dielectric layer 230 can form an ILD fill 236 within a lower portion of the channels 204, and expose predetermined regions of the underlying inner contact mask section(s) 220 and dielectric fill 180. The exposed portions of the central portion 202 can provide increased surface area for contact with a subsequently formed source/drain electrode. The ILD fill 236 can surround a portion of the central portion 202 of the source/drain contact 200, and provide a thicker insulating dielectric material around the central portion 202. The ILD fill 236 can prevent a conductive material from filling the entire channel 204, which can decrease the capacitance between a conductive source/drain contact and the gate structure. The height of the ILD fill 236 can be in the range of about 10 nm to about 50 nm, or in the range of about 15 nm to about 30 nm.

The height of the ILD fill 236 can be determined to provide a balance between resistance between the source/drain contact 200 and source/drain electrode fill, and the parasitic capacitance between the source/drain electrode fill and a gate electrode.

In various embodiments, the bridging segments 245 and underlying ILD segments 235 can cover a portion of the gate cap 170 and underlying gate structure, while the top surface of the gate spacer 140 is exposed.

Figure 15:
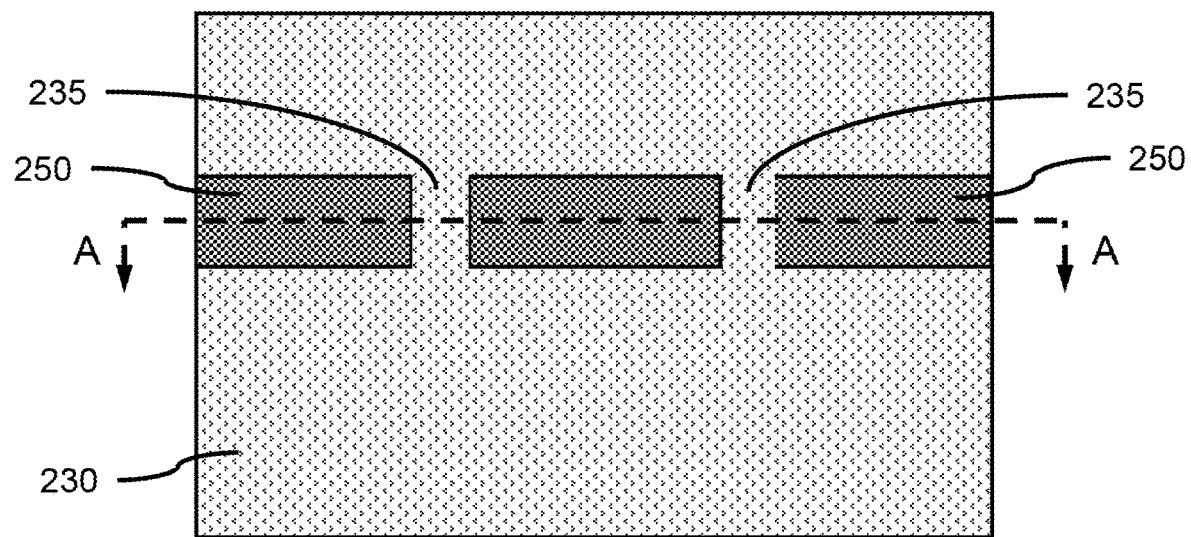
FIG. 15 is a top view showing the source/drain electrode fill in the openings in the interlayer dielectric layer after removal of the patterned cover layer, in accordance with an embodiment of the present invention.

FIG. 15 is a top view showing the source/drain electrode fill in the openings in the interlayer dielectric layer after removal of the patterned cover layer, in accordance with an embodiment of the present invention.

In one or more embodiments, the inner contact mask section 220 can be removed to expose a portion of the top surfaces of the central portion 202 of the source/drain contact 200. In various embodiments, the ILD fill 236 can reduce the region of overlap between a source/drain electrode fill and the gate structure to reduce the parasitic capacitance.

In one or more embodiments, a source/drain electrode fill 250 can be formed in the openings, where the source/drain electrode fill 250 can fill the channels 204 and cover the exposed surfaces of the central portion 202 of source/drain contact 200.

In one or more embodiments, the source/drain electrode fill 250 can be tungsten (W), cobalt (Co), or combinations thereof. In various embodiments, the source/drain electrode fill 250 can be the same or a different material from the source/drain contacts.

In one or more embodiments, a contact liner 253 can be formed on the central portion 202 of the source/drain contact 200 and exposed surface of the ILD fill 236, where the liner can be titanium (Ti), titanium nitride (TiN), cobalt (Co), or a combination thereof. The contact liner 253 can have a thickness of about 1 nm to about 3 nm.

In one or more embodiments, the cover layer 240 and bridging segments 245 can be removed to expose the underlying portions of the interlayer dielectric layer 230.

Figure 16:
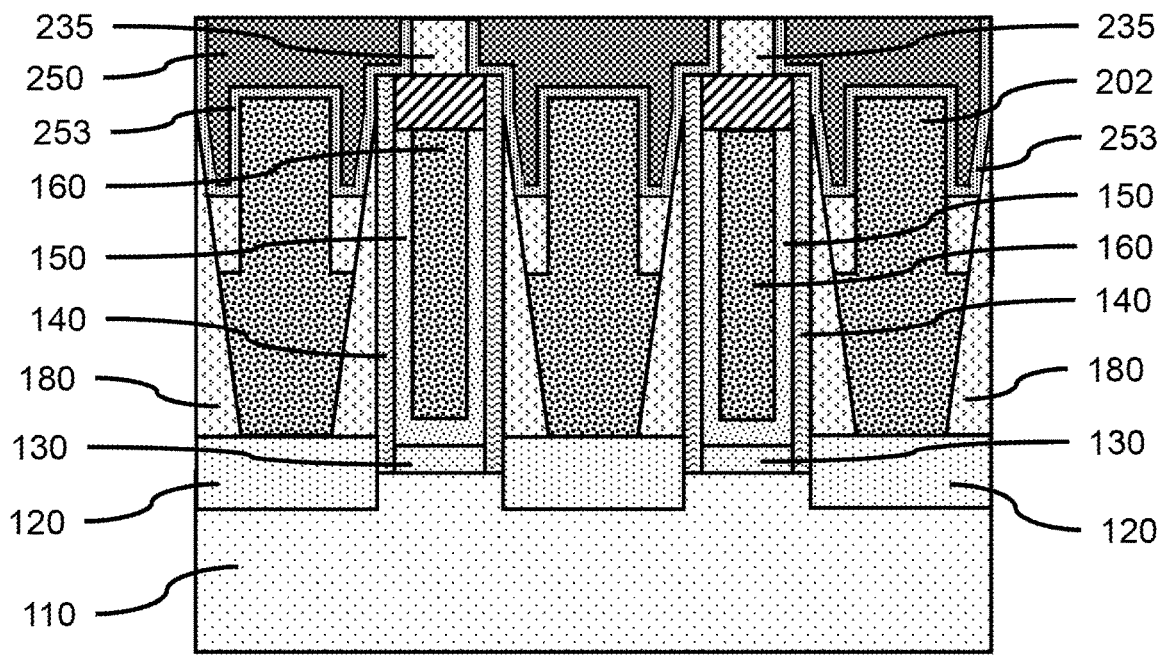
FIG. 16 is a side view of the AA cross-section of FIG. 15 showing the source/drain electrode fill in the channels and on the source/drain contacts, in accordance with an embodiment of the present invention.

FIG. 16 is a side view of the AA cross-section of FIG. 15 showing the source/drain electrode fill in the channels and on the source/drain contacts, in accordance with an embodiment of the present invention.

In various embodiments, excess material of the source/drain electrode fill 250 can be removed using CMP to provide a smooth, flat surface. A lateral spacer layer can be on the reduced-height source/drain contacts.

Figure 17:
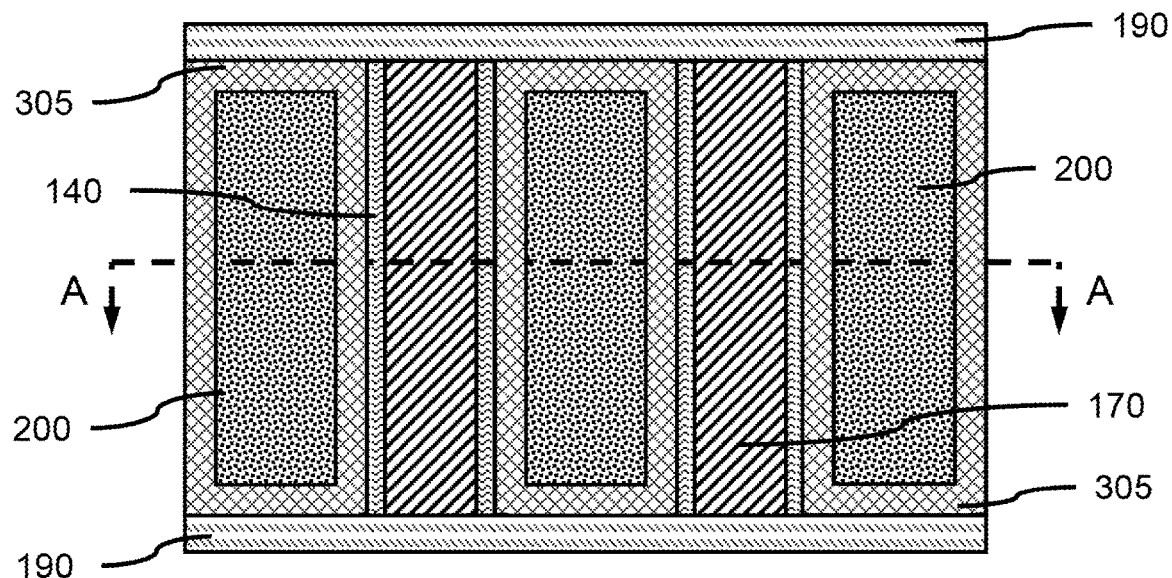
FIG. 17 is a top view showing the lateral spacer layer patterned to form lateral spacers on the source/drain contacts, in accordance with an embodiment of the present invention.

FIG. 17 is a top view showing the lateral spacer layer forming lateral spacers on the source/drain contacts, in accordance with an embodiment of the present invention.

In another embodiment, the recessed source/drain contacts 200 can be masked to provide concentric, annular masks. A portion of the source/drain contact(s) 200 can be removed to reduce the height of the source/drain contact(s) 200 relative to the tops surface of the gate spacer(s) 140 and gate cap(s) 170, as previously described.

In one or more embodiments, a lateral spacer layer can be formed on the reduced-height source/drain contacts 200, where the lateral spacer layer can be conformally deposited. The lateral spacer layer can be a silicon oxycarbide (SiOC), where the SiOC can be selectively removed (e.g., by etching). The lateral spacer layer can be on the source/drain contacts and gate caps. In one or more embodiments, the lateral spacer layer can cover the exposed surfaces of the source/drain contacts 200, gate spacers 140 and gate caps 170. In various embodiments, the lateral spacer layer can have a thickness in the range of about 5 nm to about 20 nm.

In one or more embodiments, a portion of the lateral spacer layer can be removed to form lateral spacers 305 as an annular border around the periphery of the recessed source/drain contacts 200. A central region of the source/drain contacts 200 can be exposed within the border of the lateral spacers 305. The lateral spacer layer can have a width in the range of about 2 nm to about 20 nm, or about 2 nm to about 10 nm.

Figure 18:
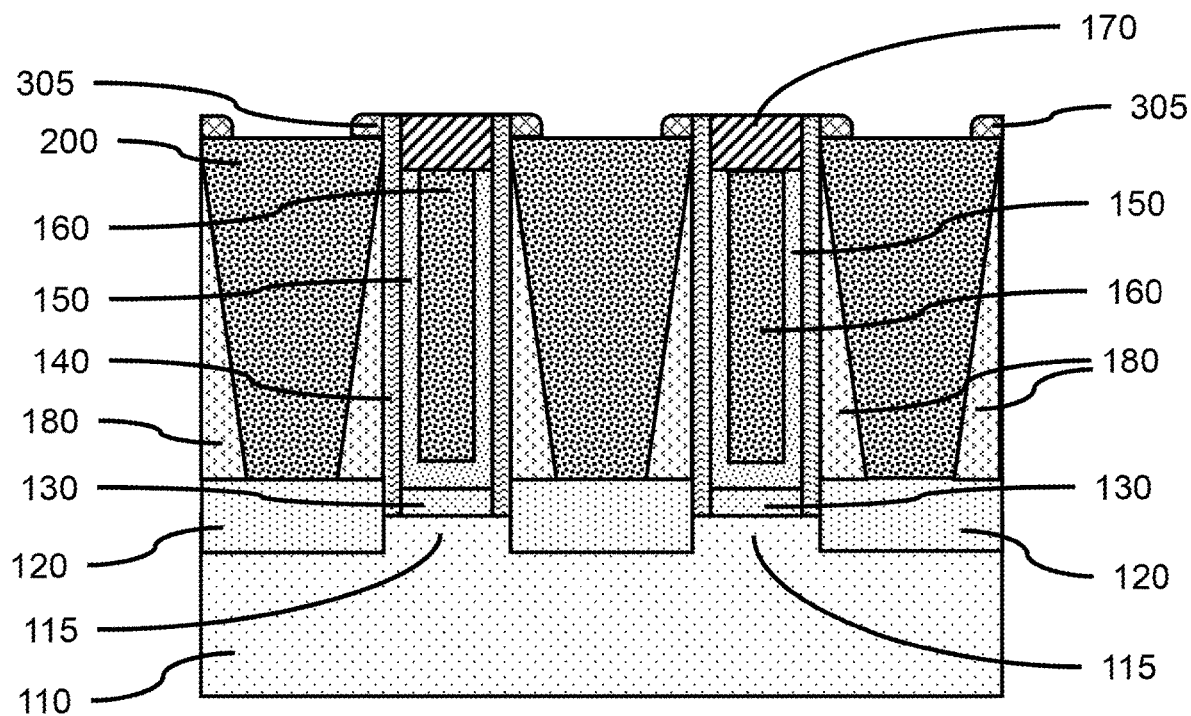
FIG. 18 is a side view of the AA cross-section of FIG. 17 showing the lateral spacers on the source/drain contacts adjacent to a gate spacer, in accordance with an embodiment of the present invention.

FIG. 18 is a side view of the AA cross-section of FIG. 17 showing the lateral spacers on the source/drain contacts adjacent to a gate spacer, in accordance with an embodiment of the present invention.

In one or more embodiments, a directional etch can be used to remove the lateral spacer layer from the horizontal surfaces, while leaving an etched-back portion of the lateral spacer layer on the vertical surfaces to form lateral spacers 305 on the source/drain contacts 200.

A pillar template layer can be on the lateral spacers and source/drain contacts, in accordance with an embodiment of the present invention.

In one or more embodiments, a pillar template layer can be formed on the gate caps 170, gate spacers 140, lateral spacers 305, and central region of the source/drain contacts 200, where the pillar template layer can be conformally deposited. The pillar template layer can be silicon oxide (SiO).

Figure 19:
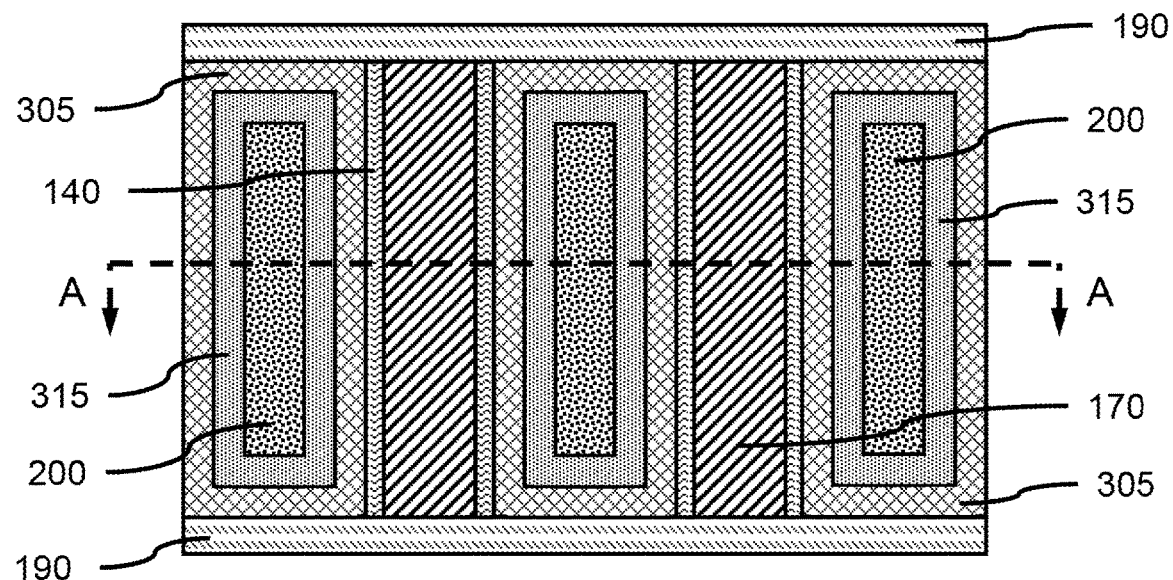
FIG. 19 is a top view showing the concentric lateral spacers and pillar templates on the source/drain contacts, in accordance with an embodiment of the present invention.

FIG. 19 is a top view showing the concentric lateral spacers and pillar templates on the source/drain contacts, in accordance with an embodiment of the present invention.

In one or more embodiments, a portion of the pillar template layer can be removed to form pillar templates 315, as an annular border around the periphery of the recessed source/drain contacts 200, and within the lateral spacers 305. A central region of the source/drain contacts 200 can be exposed within the border of the pillar templates 315. The lateral spacers 305 and pillar templates 315 can be concentric rectangular rings.

Figure 20:
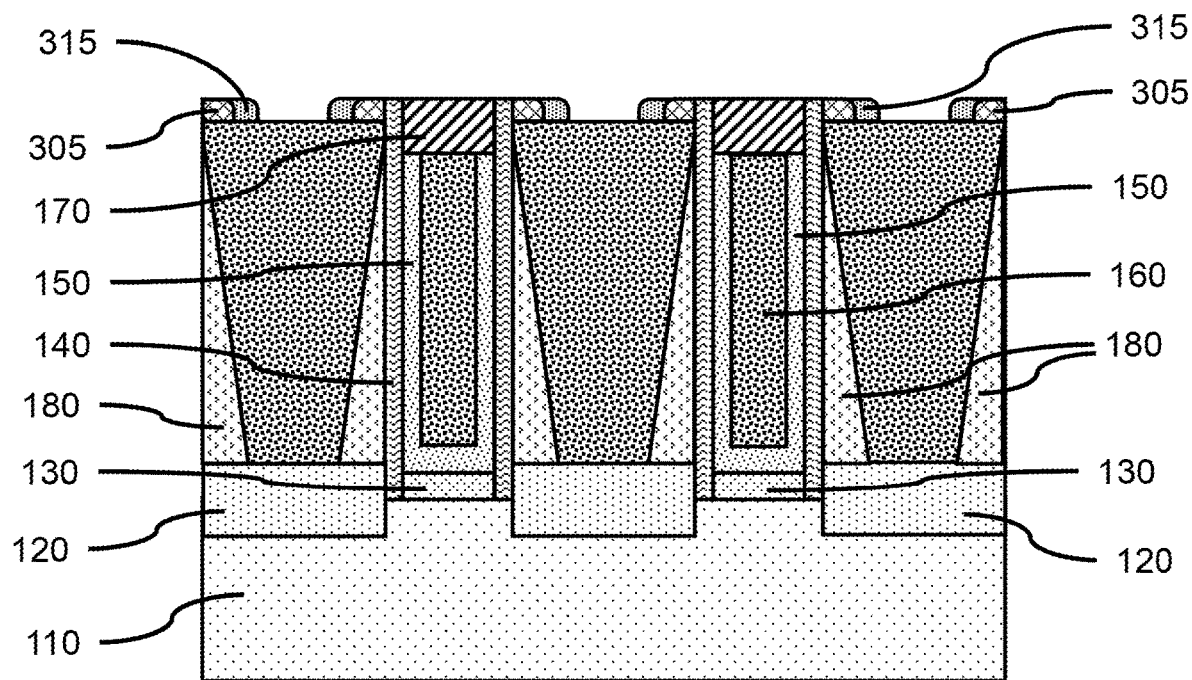
FIG. 20 is a side view of the AA cross-section of FIG. 19 showing the lateral spacers and patterned pillar templates on the source/drain contacts, in accordance with an embodiment of the present invention.

FIG. 20 is a side view of the AA cross-section of FIG. 19 showing the lateral spacers and patterned pillar templates on the source/drain contacts, in accordance with an embodiment of the present invention.

In one or more embodiments, a directional etch can be used to remove the pillar template layer from the horizontal surfaces, while leaving an etched-back portion of the pillar template layer on the vertical surfaces of the lateral spacers 305 to form pillar templates 315. This can be repeated to form multiple concentric lateral spacers 305 and pillar templates 315 until the surface area of the source/drain contacts are covered.

Figure 21:
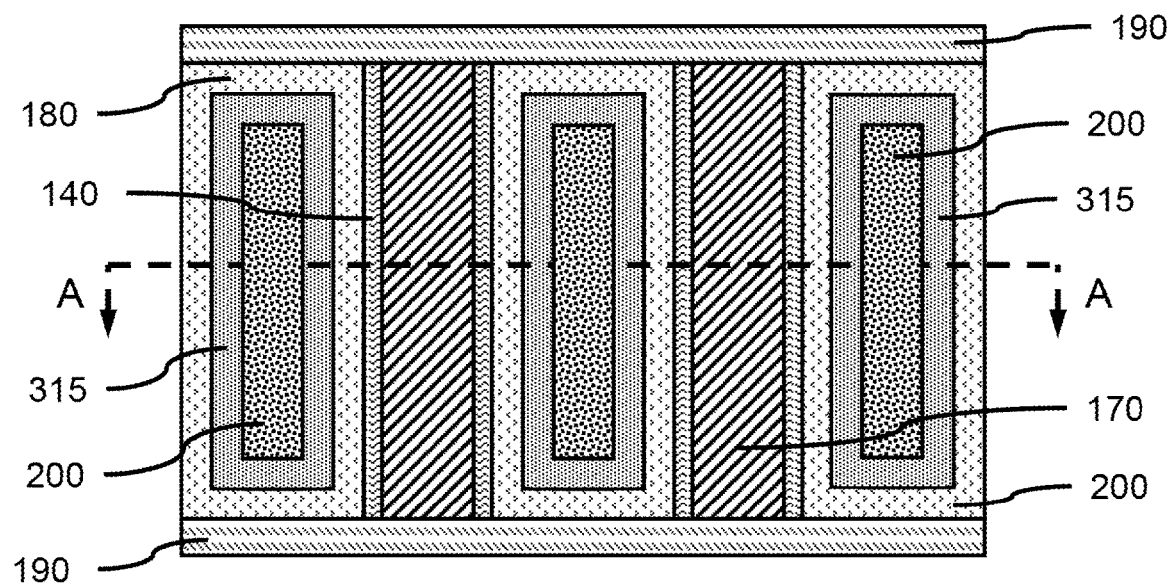
FIG. 21 is a top view showing the lateral spacer layer forming lateral spacers on the source/drain contacts, in accordance with an embodiment of the present invention.

FIG. 21 is a top view showing the exposed portions of the source/drain contacts circumscribed by the pillar templates and dielectric fill, in accordance with an embodiment of the present invention.

In one or more embodiments, the source/drain contacts 200 can be covered by lateral spacers 305 and pillar templates 315.

In one or more embodiments, the lateral spacers 305 and a lateral filler layer at the middle can be removed to leave free-standing pillar templates on the source/drain contacts. In one or more embodiments, the lateral spacers 305 and lateral filler layer can be removed to leave the pillar templates 315 free-standing on the source/drain contacts 200. The lateral spacers 305 and lateral filler layer can be removed by a selective directional etch (e.g., RIE), while the pillar templates 315 remain on the source/drain contacts 200. One or more concentric pillar templates 315 can cover a portion of the top surface of the source/drain contacts 200, where the pillar templates 315 can have a width in the range of about 5 nm to about 20 nm, or in the range of about 10 nm to about 15 nm.

In one or more embodiments, a portion of the source/drain contact 200 can be removed to form channels 204 between the pillar templates 315 and/or sidewalls of the dielectric fill 180, and a recessed middle region 208 in the source/drain contact 200. Removal of the portion of the source/drain contact 200 can leave a remaining portion of the source/drain contact 200 under the pillar template(s) 315.

Figure 22:
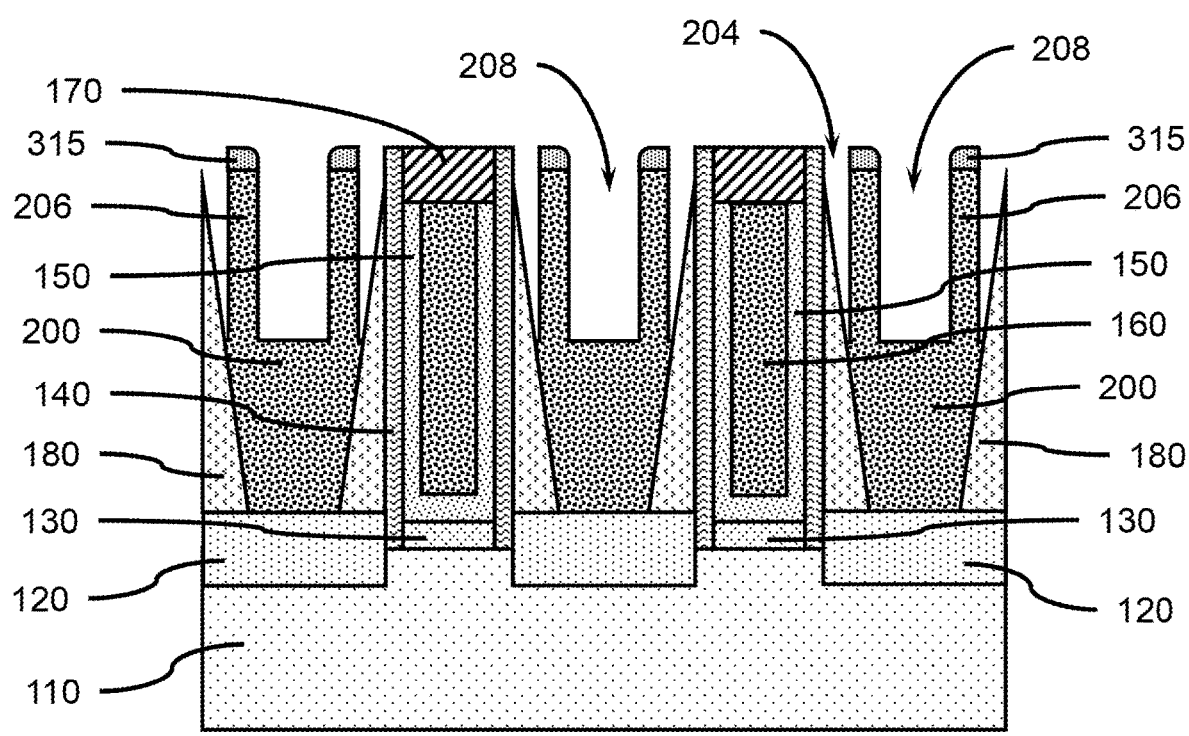
FIG. 22 is a side view of the AA cross-section of FIG. 21 showing portions of the source/drain contacts not covered by the pillar templates removed to form source/drain contact pillars, in accordance with an embodiment of the present invention.

FIG. 22 is a side view of the AA cross-section of FIG. 21 showing portions of the source/drain contacts not covered by the pillar templates removed to form source/drain contact pillars, in accordance with an embodiment of the present invention.

In various embodiments, a channel 204 can concentrically surround a source/drain contact pillar 206 formed from the source/drain contact 200, where the source/drain contact pillar 206 projects away from the surface of the remaining portion of the source/drain contact 200. If multiple concentric source/drain contact pillars 206 are formed, a channel 204 can be formed between two concentric source/drain contact pillars 206. The channels 204 can expose a flat surface of the remaining source/drain contact 200 at a predetermined depth below the top surface of the contact pillar 206, or extend down to a depth at which the channel 204 intersects the sidewall of the dielectric fill 180. The recessed middle region 208 can extend down to a predetermined depth.

In various embodiments, each of the source/drain contact pillars 206 can have a height in the range of about 10 nm to about 50 nm, or in the range of about 15 nm to about 35 nm. Each of the source/drain contact pillars 206 can have a width in the range of about 3 nm to about 20 nm, or in the range of about 5 nm to about 10 nm. In various embodiments, there can be a plurality of source/drain contact pillars 206 that each contributes an increase to the interface contact area of the source/drain contact 200.

The channel(s) 204 and recessed middle region 208 can extend to a depth in the range of about 10 nm to about 60 nm, or in the range of about 20 nm to about 40 nm, where the channel(s) 204 and recessed middle region 208 can be formed by the same directional etching process. The source/drain contact pillars 206 can have a width in the range of about 5 nm to about 20 nm, or in the range of about 10 nm to about 15 nm.

In one or more embodiments, the source/drain contact pillars 206 can increase the surface area of the source/drain contact by an amount in the range of about 200 $cm^2$ to about 400 $cm^2$, where the increased surface area can be the height of the source/drain contact pillars 206 multiplied by 2 times the length plus the width of each of the inner and outer walls. (Area=H×(2×($L_{out}$+$W_{out}$))+(2×($L_{in}$+$W_{in}$))).

Figure 23:
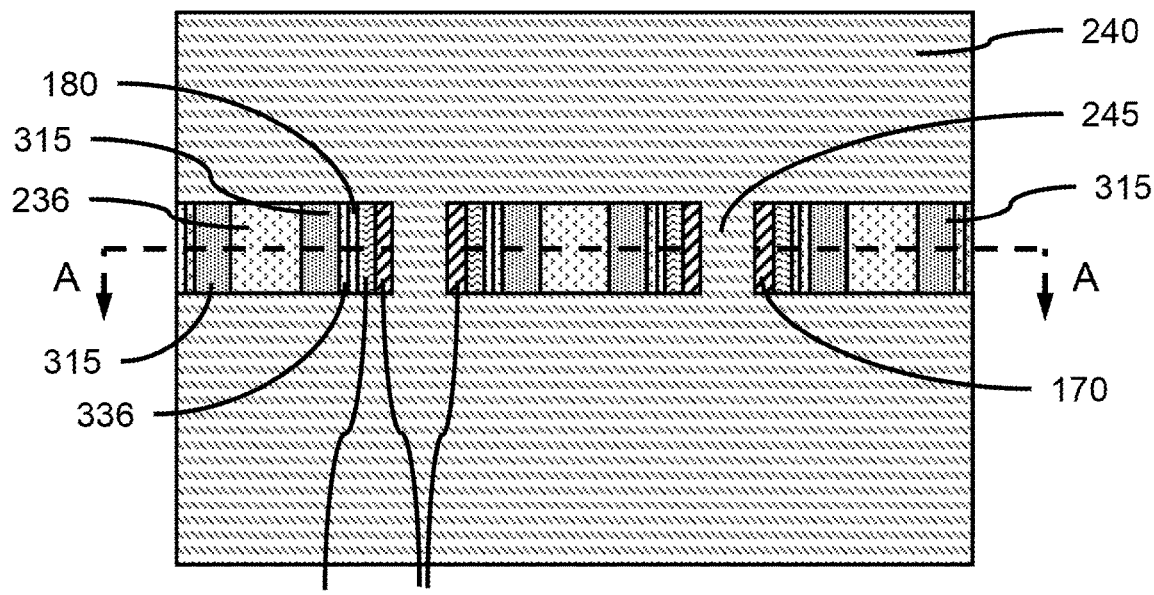
FIG. 23 is a top view showing the interlayer dielectric segments and top surfaces of the pillar templates in the openings formed in the patterned cover layer, in accordance with an embodiment of the present invention.

FIG. 23 is a top view showing the interlayer dielectric segments and top surfaces of the pillar templates in the openings formed in the patterned cover layer, in accordance with an embodiment of the present invention.

In one or more embodiments, a cover layer 240 can be patterned on an interlayer dielectric layer 230 that is on the source/drain contact pillars 206 and covering the gate caps 170. An interlayer dielectric (ILD) layer 230 can be formed on the exposed surfaces of the pillar templates 315, gate cap(s) 170, gate spacers 140, source/drain contact pillar(s) 206, and source/drain contact 200.

In one or more embodiments, the interlayer dielectric layer 230 can be silicon oxide (SiO), a low-k dielectric, a flowable polymeric material, or a combination thereof, where the interlayer dielectric layer 230 can be a different material from the dielectric fill 180, so the interlayer dielectric layer 230 can be selectively removed relative to the dielectric fill 180. In various embodiments, interlayer dielectric layer 230 and dielectric fill 180 can be the same material.

In one or more embodiments, a cover layer 240 can be formed and patterned on the interlayer dielectric layer 230 to form aligned openings exposing predetermined portions of the underlying interlayer dielectric layer 230, such that bridging segments 245 are formed from the cover layer 240 that remain above at least a portion of the gate cap(s) 170. In various embodiments, the cover layer 240 can be a polymeric resist material.

In one or more embodiments, the interlayer dielectric layer 230 can be formed in the channel(s) 204 and recessed middle region 208, where the interlayer dielectric layer 230 fills in the channel(s) 204 and recessed middle region 208.

In one or more embodiments, the portion(s) of the interlayer dielectric layer 230 exposed by the openings in the cover layer 240 can be removed, whereas the portion(s) of the interlayer dielectric layer 230 covered by the bridging segments 245 can provide underlying ILD segments 235. A portion of the gate spacer(s) 140 and gate cap(s) can be exposed by the partial removal of the interlayer dielectric layer 230.

Figure 24:
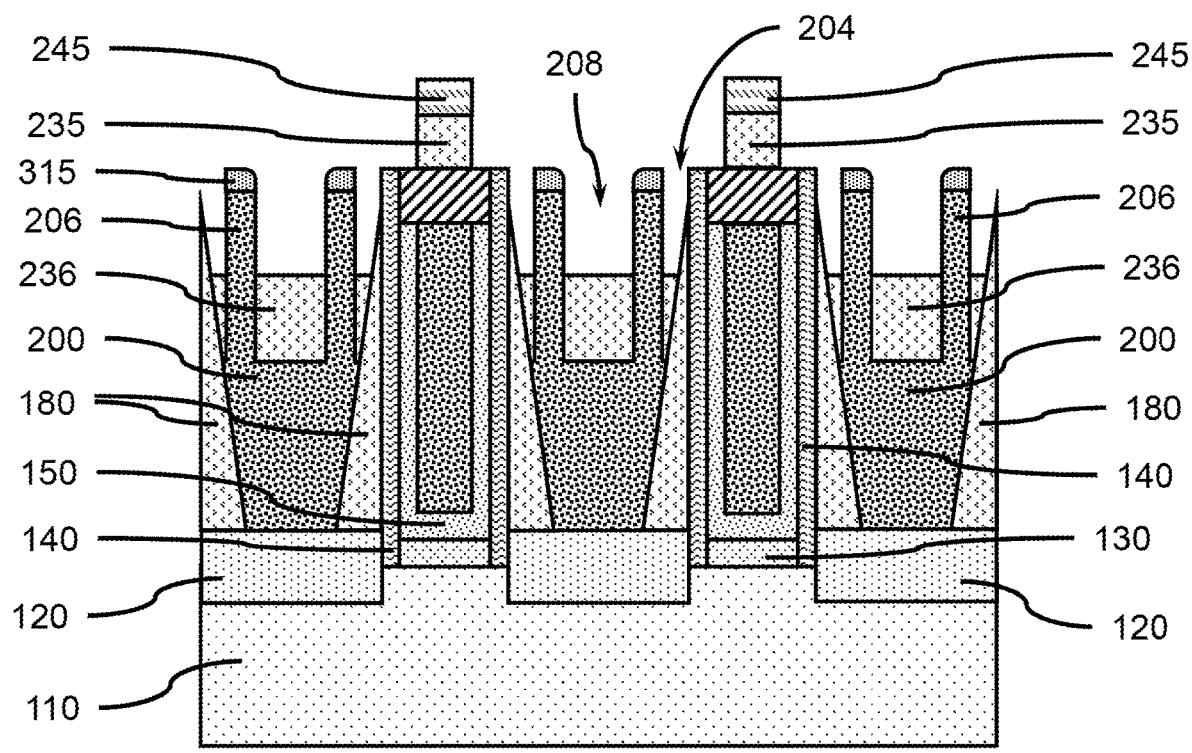
FIG. 24 is a side view of the AA cross-section of FIG. 23 showing the interlayer dielectric segments in the area between the source/drain contact pillars, in accordance with an embodiment of the present invention.

FIG. 24 is a side view of the AA cross-section of FIG. 23 showing the interlayer dielectric segments in the area between the source/drain contact pillars, in accordance with an embodiment of the present invention.

In one or more embodiments, the portion(s) of the interlayer dielectric layer 230 exposed by the openings in the cover layer 240 can be removed, whereas the portion(s) of the interlayer dielectric layer 230 covered by the bridging segments 245 can provide underlying ILD segments 235. A portion of the gate spacer(s) 140 and gate cap(s) 170 can be exposed by the partial removal of the interlayer dielectric layer 230.

Removal of the portion(s) of the interlayer dielectric layer 230 can form an ILD fill 236 within a lower portion of the channel(s) 204 and recessed middle region 208, and expose predetermined regions of the pillar templates 315 and dielectric fill 180. The exposed portions of the source/drain contact pillar(s) 206 can provide increased surface area for contact with a subsequently formed source/drain electrode. The ILD fill 236 can surround a portion of the source/drain contact pillar(s) 206 and cover a portion of the source/drain contact 200. The ILD fill 236 within the lower portion of the channel(s) 204 and recessed middle region 208 can provide an insulating dielectric to electrically insulate an electrical contact on each side of the gate structure, and to decrease capacitance between the gate structure and the source/drain electrode fill.

In various embodiments, the bridging segments 245 and underlying ILD segments 235 can cover a portion of the gate cap 170 and underlying gate structure, while the top surface of the gate spacer 140 is exposed. The ILD segments 235 can electrically isolate adjacent source/drain electrode fill 250.

Figure 25:
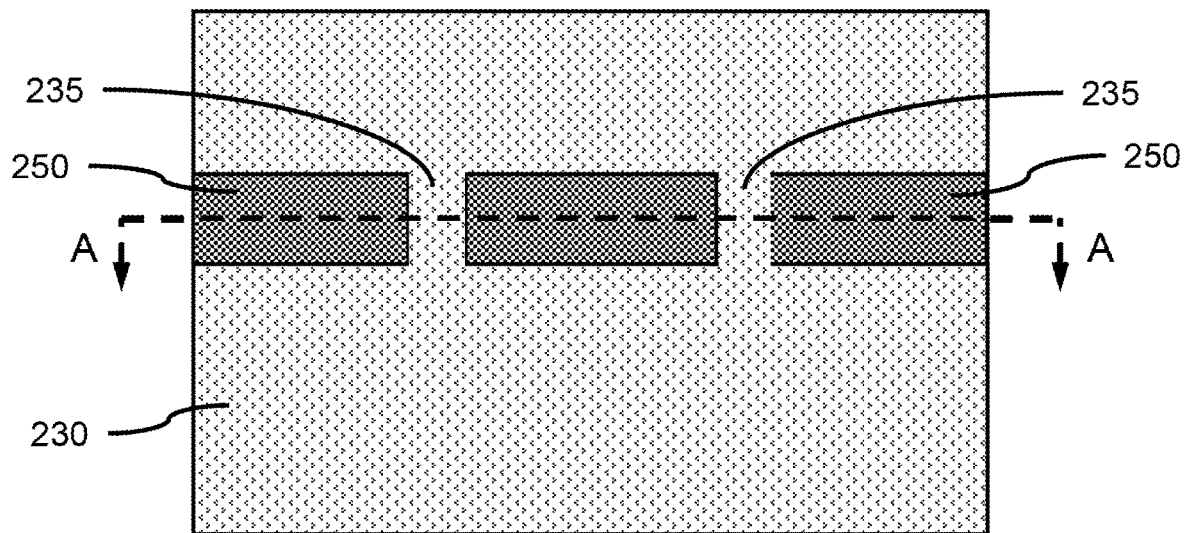
FIG. 25 is a top view showing the source/drain electrode fill in the openings in the interlayer dielectric layer after removal of the patterned cover layer, in accordance with an embodiment of the present invention.

FIG. 25 is a top view showing the source/drain electrode fill in the openings in the interlayer dielectric layer after removal of the patterned cover layer, in accordance with an embodiment of the present invention.

In one or more embodiments, the pillar templates 315 can be removed from the top surface of the source/drain contact pillar(s) 206, where the pillar templates 315 can be removed using an isotropic or directional selective etch, (e.g., wet chemical etch or RIE).

In one or more embodiments, a source/drain electrode fill 250 can be formed in the openings, where the source/drain electrode fill 250 can be blanket deposited to fill the channel(s) 204 and recessed middle region 208, and cover the exposed surfaces of the source/drain contact pillar(s) 206. In one or more embodiments, the source/drain electrode fill 250 can be a metal (e.g., W, Co, Mo, Cu, Ta, Ti), and combinations thereof.

Figure 26:
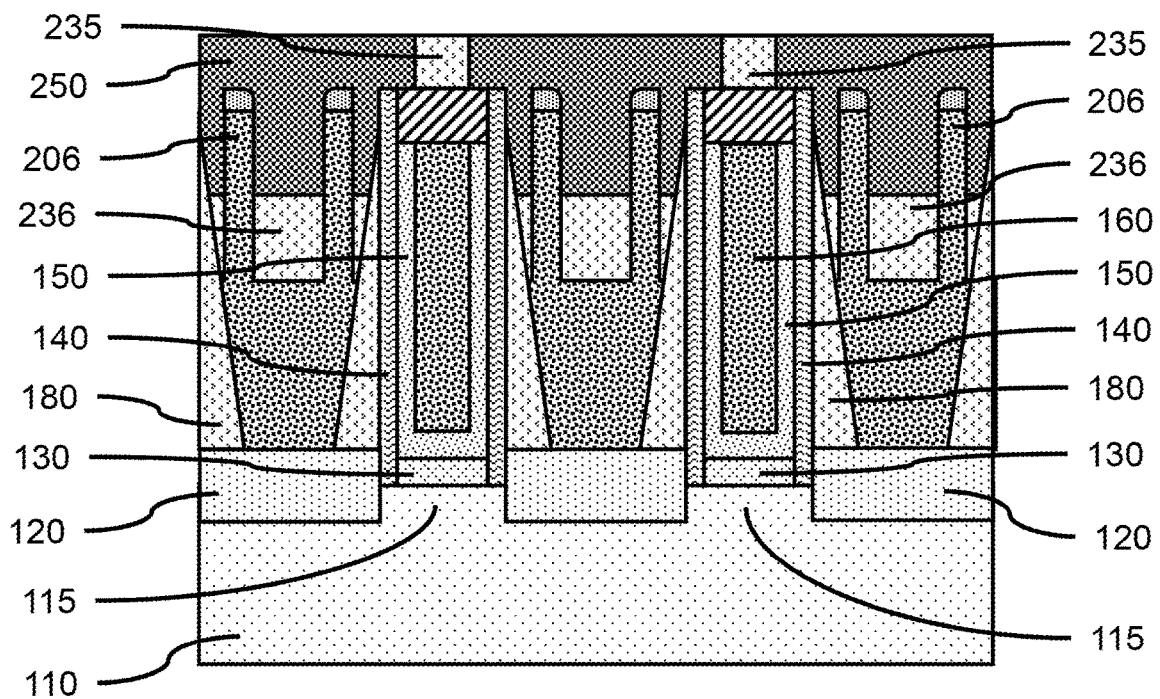
FIG. 26 is a side view of the AA cross-section of FIG. 25 showing the source/drain electrode fill separated by the ILD segments on the source/drain contact pillars, in accordance with an embodiment of the present invention.

FIG. 26 is a side view of the AA cross-section of FIG. 25 showing the source/drain electrode fill separated by the ILD segments on the source/drain contact pillars, in accordance with an embodiment of the present invention.

In one or more embodiments, a source/drain electrode fill 250 can be formed on the source/drain contact pillars 206, where the source/drain electrode fill 250 can be in contact with the sidewalls and top surface of the source/drain contact pillars 206. The source/drain electrode fill 250 can fill in the channels 204 surrounding the source/drain contact pillars 206 and the recessed middle region 208. The configuration and geometry of the source/drain contact pillars 206 and source/drain electrode fill 250 can provide a field effect device having a source/drain contact with reduced capacitance and resistance.

It will be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

Having described preferred embodiments of a device and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A field effect device having a source/drain contact with reduced capacitance and resistance, comprising:
   a source/drain on an active region of a substrate;
   a source/drain contact on a first portion of the source/drain;
   a dielectric fill on a second portion of the source/drain, where the dielectric fill is on four sides of the source/drain contact;
   a gate spacer that separates the dielectric fill from a gate structure; and
   an ILD fill located between a top surface of the source/drain contact and a lower portion of the source/drain contact, and between a portion of the dielectric fill and a portion of the source/drain contact, wherein the lower portion of the source/drain contact separates the ILD fill from the source/drain.

2. The field effect device of claim 1, wherein the dielectric fill has sloping sidewalls.

3. The field effect device of claim 1, wherein the portion of the source/drain contact adjoining the ILD fill is a source/drain contact pillar.

4. The field effect device of claim 3, wherein a portion of the ILD fill is surrounded by the source/drain contact pillar.

5. The field effect device of claim 3, further comprising a pillar template on the source/drain contact pillar.

6. The field effect device of claim 5, wherein the ILD fill and the dielectric fill are each a material selected from the group consisting of silicon oxide (SiO), a low-k dielectric, a flowable polymeric material, and combinations thereof.

7. The field effect device of claim 6, wherein the ILD fill and the dielectric fill are the same material.

8. The field effect device of claim 1, wherein the source/drain contact is a conductive metal selected from the group consisting of tungsten (W), cobalt (Co), and combinations thereof.

9. The field effect device of claim 8, further comprising a source/drain electrode fill on the ILD fill and source/drain contact pillar, wherein the source/drain electrode fill is a conductive metal selected from the group consisting of tungsten (W), cobalt (Co), and combinations thereof.

10. A field effect device having a source/drain contact with reduced capacitance and resistance, comprising:
- a source/drain and a channel region on an active region of a substrate;
- a source/drain contact on a first portion of the source/drain;
- a dielectric fill on a second portion of the source/drain, where the dielectric fill is on four sides of the source/drain contact and adjoining a gate spacer that separates the dielectric fill from a gate structure;
- an ILD fill located between a top surface of the source/drain contact and a lower portion of the source/drain contact, and between a portion of the dielectric fill and a first portion of the source/drain contact, and wherein the lower portion of the source/drain contact separates the ILD fill from the source/drain; and
- a source/drain electrode fill on the ILD fill and a second portion of the source/drain contact above the ILD fill.

11. The field effect device of claim 10, further comprising a contact liner between the source/drain electrode fill and the second portion of the source/drain contact.

12. The field effect device of claim 10, wherein the first portion of the source/drain contact adjoining the ILD fill, and the second portion of the source/drain contact adjoining the source/drain electrode fill is a source/drain contact pillar.

13. The field effect device of claim 10, wherein a portion of the ILD fill is surrounded by the source/drain contact pillar.

14. The field effect device of claim 10, further comprising a gate structure in contact with a side of the gate spacer opposite the dielectric fill, wherein the gate spacer physically and electrically separates the dielectric fill from the gate structure.

15. A field effect device having a source/drain contact with reduced capacitance and resistance, comprising:
- a gate spacer and a gate structure on an active region of a substrate;
- a source/drain on each of opposite sides of the gate structure;
- a source/drain contact on a first portion of each of the source/drains;
- a dielectric fill on a second portion of each of the source/drains,
  - wherein the dielectric fill is on four sides of the source/drain contact and in direct contact with the source/drain contact;
- an ILD fill located between a top surface of the source/drain contact and a lower portion of the source/drain contact, and
  - between a portion of the dielectric fill and a central portion of the source/drain contact, and
  - wherein the lower portion of the source/drain contact separates the ILD fill from the source drain; and
- a source/drain electrode fill on the ILD fill and the central portion of the source/drain contact above the ILD fill.

16. The field effect device of claim 15, wherein the dielectric fill has sloping sidewalls.

17. The field effect device of claim 15, further comprising a contact liner between the source/drain electrode fill and the central portion of the source/drain contact above the ILD fill.

18. The field effect device of claim 15, further comprising a recessed middle region in the central portion of the source/drain contact, thereby forming a source/drain pillar.

19. The field effect device of claim 18, wherein a portion of the ILD fill is within the recessed middle region.

20. The field effect device of claim 18, wherein the source/drain pillar has a height in the range of about 10 nm to about 50 nm.

* * * * *